(12) United States Patent
Uriu et al.

(10) Patent No.: US 6,882,250 B2
(45) Date of Patent: Apr. 19, 2005

(54) HIGH-FREQUENCY DEVICE AND COMMUNICATION APPARATUS

(75) Inventors: Kazuhide Uriu, Osaka (JP); Hiroyuki Nakamura, Osaka (JP); Toshio Ishizaki, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/413,651

(22) Filed: Apr. 15, 2003

(65) Prior Publication Data

US 2004/0012461 A1 Jan. 22, 2004

(30) Foreign Application Priority Data

Apr. 15, 2002 (JP) ........................................ 2002-112564

(51) Int. Cl.[7] ................................................. H03H 9/64
(52) U.S. Cl. ....................... 333/193; 333/195; 333/133
(58) Field of Search ................................ 333/193–196, 333/133; 310/313 R, 313 B, 313 C, 313 D

(56) References Cited

U.S. PATENT DOCUMENTS

| | | | | |
|---|---|---|---|---|
| 5,521,554 A | * | 5/1996 | Okazaki | ..................... 330/306 |
| 5,568,002 A | | 10/1996 | Kawakatsu et al. | |
| 5,757,248 A | * | 5/1998 | Bardal | .......................... 333/33 |
| 5,994,980 A | * | 11/1999 | Tada | ........................... 333/193 |
| 6,424,239 B1 | * | 7/2002 | Ehara et al. | ................. 333/193 |
| 6,437,478 B1 | * | 8/2002 | Yamamo To | ............ 310/313 B |
| 6,498,548 B2 | * | 12/2002 | Kaneda et al. | ............... 333/195 |
| 6,531,933 B2 | * | 3/2003 | Miyamoto et al. | .......... 333/133 |
| 6,606,016 B2 | * | 8/2003 | Takamine | .................... 333/133 |
| 6,713,940 B2 | * | 3/2004 | Takamine | ............... 310/313 R |
| 6,714,099 B2 | * | 3/2004 | Hikita et al. | ................. 333/133 |
| 2001/0043024 A1 | | 11/2001 | Takamine et al. | |

FOREIGN PATENT DOCUMENTS

JP                6-204781         7/1994

* cited by examiner

Primary Examiner—Timothy P. Callahan
Assistant Examiner—Hai L. Nguyen
(74) Attorney, Agent, or Firm—RatnerPrestia

(57) ABSTRACT

Interdigital transducers (IDT electrodes), reflectors, etc., are formed on a piezoelectric substrate. An unbalanced input/output terminal is connected to a first input/output terminal. A first inductor is connected between a first terminal, which is one of the balanced input/output terminals, and a second terminal, which is the other of the balanced input/output terminals. Further, a second inductor is connected between the first terminal in the balanced input/output terminals and a second input/output terminal, and the second terminal in the balanced input/output terminals is connected to a third input/output terminal.

21 Claims, 15 Drawing Sheets

Fig. 9 (a) PRIOR ART
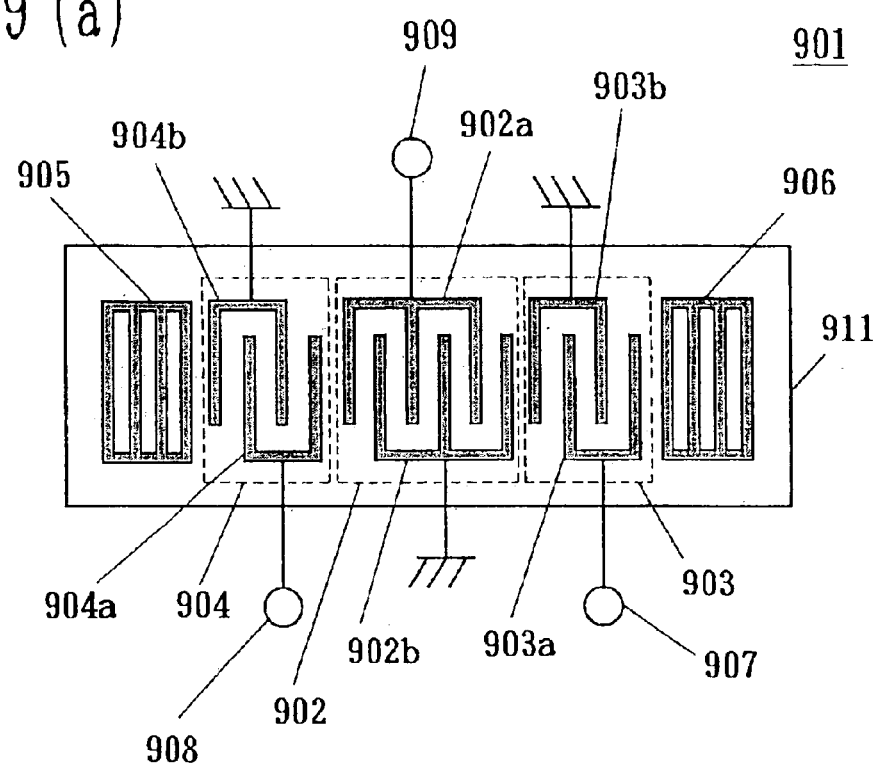
Fig. 9 (b) PRIOR ART
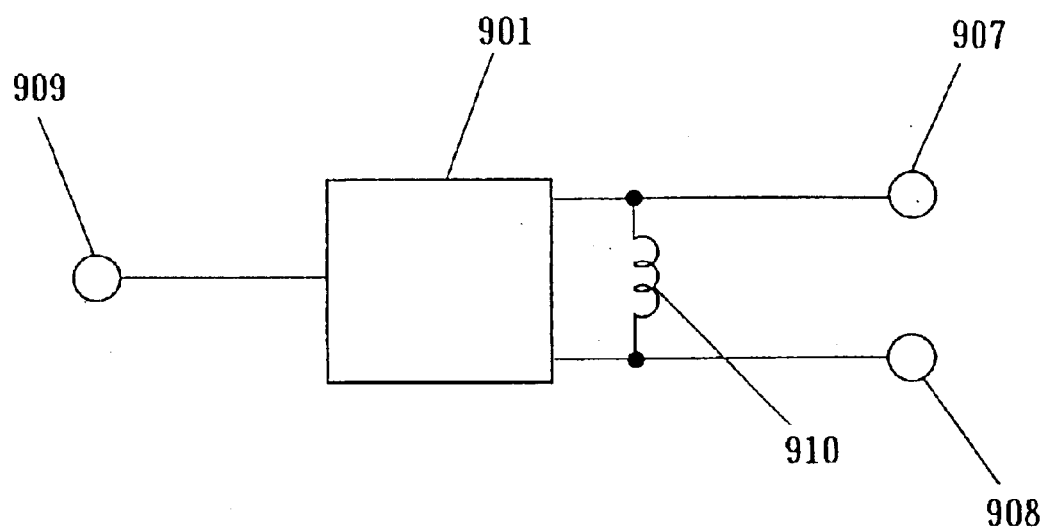

Fig. 10 (a) PRIOR ART
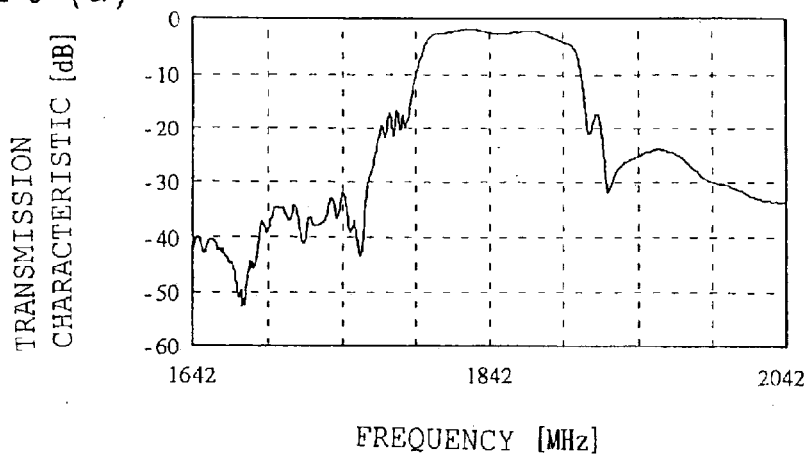
Fig. 10 (b) PRIOR ART
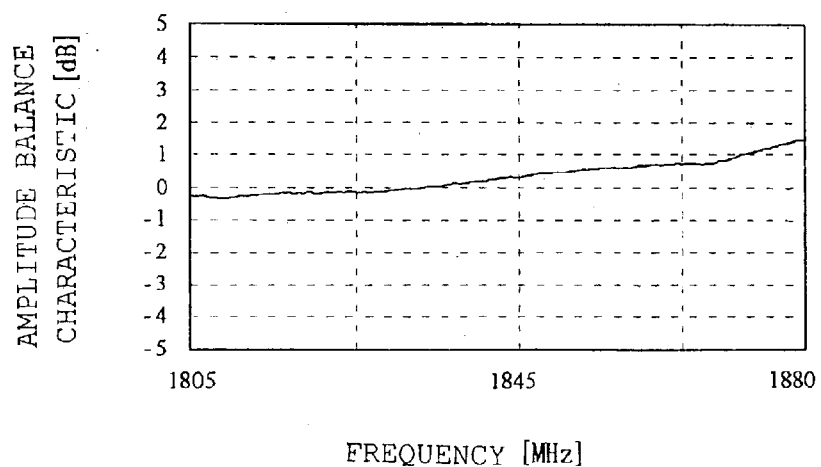
Fig. 10 (c) PRIOR ART
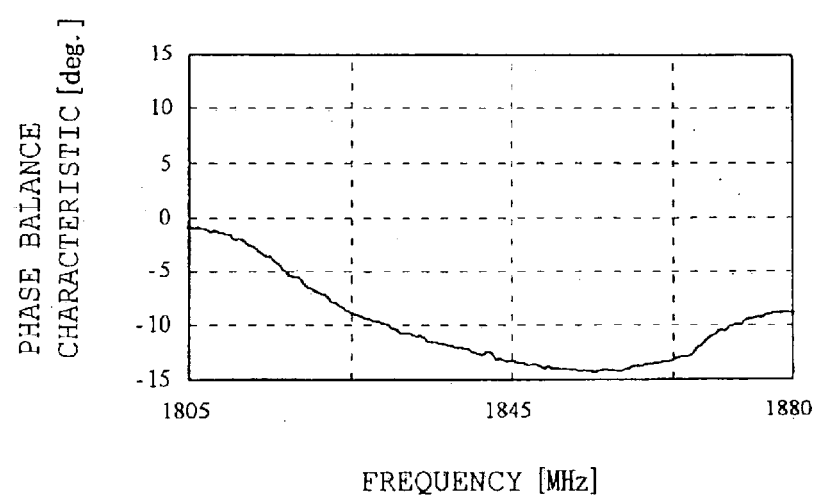

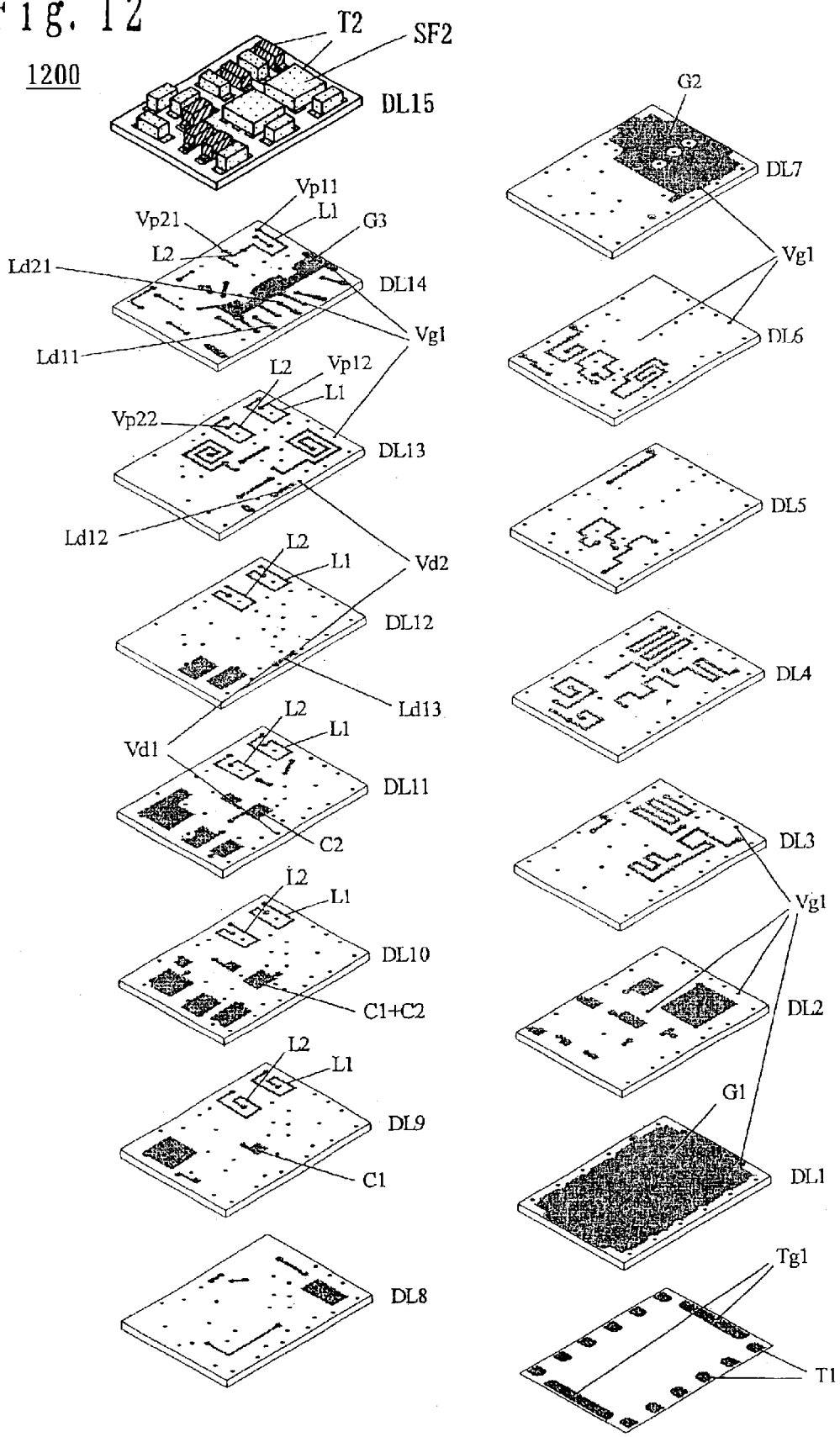

HIGH-FREQUENCY DEVICE AND COMMUNICATION APPARATUS

BACKGROUND OF THE INVENTION

1. Field of the Invention

The present invention relates to a surface acoustic wave filter and a composite electronic component, which are employed, for example, in a portable telephone.

2. Related Art of the Invention

In recent years, with the development of mobile communication, it has become very desirable to have communication device components higher in performance and smaller in size. The development of balanced semiconductor components such as ICs have advanced in improving anti-noise characteristics, and balanced filters for use in an RF stage. Conventionally surface acoustic wave filters have been widely used as RF stage filters in mobile communication devices. Longitudinal-mode surface acoustic wave filters have been capable of balanced/unbalanced conversion owing to the structure of their interdigital transducer electrodes. RF stage filters which use longitudinal-mode surface acoustic wave filters and have balanced input/output terminals are desired to have low-loss, high-attenuation and good balance characteristics.

A conventional longitudinal-mode surface acoustic wave filter having balanced input/output terminals will be described with reference to the drawings.

FIG. 9(a) shows the construction of a conventional longitudinal-mode surface acoustic wave filter having balanced input/output terminals (for example, see Japanese Laid-open No.Hei 6-204781). Referring to FIG. 9(a), the surface acoustic wave filter 901 is constituted by first, second, and third interdigital transducer electrodes (hereinafter referred to as "IDT electrodes") 902, 903, and 904, and first and second reflector electrodes 905 and 906 on a piezoelectric substrate 911. A group of electrode fingers 902a in two groups of electrode fingers of the first IDT electrode 902 is connected to an unbalanced input/output terminal 909, while the other group of electrode fingers 902b of the first IDT electrode 902 is grounded. A group of electrode fingers 903a in two groups of electrode fingers of the second IDT electrode 903 is connected to a first terminal 907, which is one of balanced input/output terminals, while the other group of electrode fingers 903b is grounded. A group of electrode fingers 904a in two groups of electrode fingers of the third IDT electrode 904 is connected to a second terminal 908, which is the other of the balanced input/output terminals, while the other group of electrode fingers 904b is grounded.

The surface acoustic wave filter having unbalanced and balanced input/output terminals is obtained by being constructed as described above. In actuality, the unbalanced input/output terminal 909 and the balanced input/output terminals 907 and 908 are formed on one piezoelectric substrate on which the IDT electrodes 902 and 903 are also formed. However, the input/output terminals in this example are schematically shown as if they are out of the piezoelectric substrate 911.

Referring to FIG. 9(b), a first inductor 910 for impedance matching in the surface acoustic wave filter 901 is connected between the balanced input/output terminals, i.e., the first and second terminals 907 and 908. By adopting this configuration, impedance matching between the first and second terminals 907 and 908 provided as balanced input/output terminals is achieved.

In a filter such as the above one, to enable this filter to have good balance characteristics, the IDT electrodes 902 to 904 and the first and second reflector electrodes 905 and 906 constituting the surface acoustic wave filter are designed and laid out so that they are closer to a state of being symmetrical about the electrode finger group 902a connected to the unbalanced input/output terminal 909. The entire disclosure of Japanese Laid-Open No.Hei6-204781 is incorporated herein by reference.

FIGS. 10(a), 10(b), and 10(c) are diagrams showing characteristics of the conventional surface acoustic wave filter shown in FIG. 9. However, as an example, the filter which is operated in 188 MHz band is shown. FIG. 10(a) shows a transmission characteristic, FIG. 10(b) shows an amplitude balance characteristic in the passband (from 1805 MHz to 1880 MHz), and FIG. 10(c) shows a phase balance characteristic in the passband. The amplitude balance characteristic is an indication of the amplitude difference between the amplitude of a signal between the first terminal 907 in the balanced input/output terminals and the unbalanced input/output terminal 909, and the amplitude of a signal between the second terminal 908 in the balanced input/output terminals and the unbalanced input/output terminal 909. If the value of this difference is zero, there is no deterioration in amplitude balance characteristic.

The phase balance characteristic is an indication of the shift from 180 degrees of the phase difference between the phase of a signal between the first terminal 907 in the balanced input/output terminals and the unbalanced input/output terminal 909, and the phase of a signal between the second terminal 908 in the balanced input/output terminals and the unbalanced input/output terminal 909. If the value of this difference is zero, there is no deterioration in phase balance characteristic.

The balance characteristics shown in FIGS. 10(b) and 10(c) are characteristics as seen at the first terminal 907 from the second terminal 908. Each of the two balance characteristics seen in the opposite direction is shown by inverting the representation in the graph in FIG. 10(b) or 10(c) about the central horizontal line.

The above-described surface acoustic wave filter, however, has a problem that, despite of the symmetrical construction, the amplitude balance characteristic is −0.3 dB to +1.4 dB in the passband, the phase balance characteristic is −14° to −1° in the passband. Thus there is a large magnitude deterioration in the balance characteristics which are considered one of the important electrical characteristics.

The deterioration in balance characteristics are due not only to the construction but also to coupling between the input/output IDT electrodes by parasitic components.

For example, in the surface acoustic wave filter 901 shown in FIG. 9, the number of electrode fingers in the distance range to the first terminal 907 in the balanced input/output terminals seen from the unbalanced input/output terminal 909 and the number of electrode fingers in the distance range to the second terminal 908 in the balanced input/output terminals seen from the unbalanced input/output terminal 909 are different from each other. Therefore the sums of parasitic components between the corresponding groups of electrode fingers are also different. An unbalance of coupling between the IDT electrodes results therefrom.

In a frequency band, e.g., the 800–900 MHz band, a deterioration in balance characteristics does not occur easily. However, if the system is adapted for use at higher frequencies, transmission and reception of signals at a higher frequency, e.g., 1800 MHz is performed as mentioned above. As the operating frequency is increased, the influence of deterioration in balance characteristics increases and the design must consider this problem.

However, even if the filter is designed, for example, so that (1) the number of electrode fingers in the distance range to the first terminal 907 in the balanced input/output terminals seen from the unbalanced input/output terminal 909 and (2) the number of electrode fingers in the distance range to the second terminal 908 in the balanced input/output terminals seen from the unbalanced input/output terminal 909, are equal to each other. The shapes, however, of the IDT electrodes 903 and 904 cannot be made ideally symmetrical with each other and, therefore, the coupling between the IDT electrodes cannot be balanced.

Further, deterioration in balance characteristics may occur even in balanced filters such as cylindrical filters and dielectric filters supposed to be readily capable of a design of a symmetrical layout as well as in surface acoustic wave filters, and there has been a demand for an effective solution of this problem.

SUMMARY OF THE INVENTION

The present invention has been achieved in consideration of the above-described problem, and an object of the present invention is to provide a high-frequency device which incorporates a high-frequency element having balanced input/output terminals and operating in a high-frequency band, and which has improved balance characteristics, and a communication apparatus using the high-frequency device.

The 1st aspect of the present invention is a high-frequency device comprising:

a high-frequency element having at least one pair of balanced terminals; and external input/output terminals connected to terminals of said high-frequency element, wherein the impedance values between the pair of balanced terminals and the external input/output terminals connected to the pair of balanced terminals are different from each other.

The 2nd aspect of the present invention is the high-frequency device according to the 1st aspect, wherein the difference of impedance values means that the impedance value of the one of the pair of balanced terminals having a phase advance relative to the other of the pair of balanced terminals is larger than that of the other of the pair of balanced terminals.

The 3rd aspect of the present invention is the high-frequency device according to the 2nd aspect, further comprising a first reactance element provided between at least one of the pair of balanced terminals and the external input/output terminal connected to the one of the pair of balanced terminals.

The 4th aspect of the present invention is the high-frequency device according to the 3rd aspect, further comprising a second reactance element provided between the other of the pair of balanced terminals and the external input/output terminal connected to the other of the pair of balanced terminals, the second reactance element differing in impedance value from the first reactance element.

The 5th aspect of the present invention is the high-frequency device according to the 3rd or the 4th aspect, wherein at least one of said first reactance element and said second reactance element is realized as an inductance component of a wire used when said high-frequency element is mounted by wire bonding in said high frequency device.

The 6th aspect of the present invention is the high-frequency device according to the 4th aspect, wherein a value obtained by standardizing the difference between the impedance values of said first reactance element and said second reactance element with respect to the terminal impedance is not larger than 0.2.

The 7th aspect of the present invention is the high-frequency device according to the 3rd or the 4th aspect, further comprising a multilayer substrate having a surface-layer electrode provided on its one major surface, an inner-layer electrode on at least one layer provided in said multilayer substrate, and a via hole electrode which connects said surface-layer electrode and said inner-layer electrode to each other, wherein each of said external input/output terminals is realized as said surface-layer electrode;

said high-frequency device is mounted on the other major surface of said substrate; and at least one of said first reactance element and said second reactance element is provided by an inductance component based on said inner-layer electrode.

The 8th aspect of the present invention is the high-frequency device according to the 2nd aspect, further comprising a first susceptance element having its one end connected between at least one of the pair of balanced terminals and the external input/output terminal connected to the one of the pair of balanced terminals, and having the other end grounded.

The 9th aspect of the present invention is the high-frequency device according to the 8th apsect, further comprising a second susceptance element having its one end connected between the other of the pair of balanced terminals and the external input/output terminal connected to the other of the pair of balanced terminals, and having the other end grounded, the second susceptance element differing in admittance value from the first susceptance element.

The 10th aspect of the present invention is the high-frequency device according to the 9th aspect, wherein a value obtained by standardizing the difference between the admittance values of said first susceptance element and said second susceptance element with respect to the terminal impedance is equal to or larger than 5.

The 11th aspect of the present invention is the high-frequency device according to the 4th aspect, further comprising:

a plurality of dielectric layers forming a multilayer structure;

interlayer electrodes provided between said dielectric layers; and a via hole conductor provided so as to straddle some of said plurality of dielectric layers, said via hole conductor connecting all or part of said interlayer electrodes, wherein said interlayer electrodes and said via hole conductor form a plurality of strip lines and a plurality of capacitors, and said first reactance element and said second reactance element are formed by said plurality of strip lines, said plurality of capacitors and said via hole conductor.

The 12th aspect of the present invention is the high-frequency device according to the 4th apsect, further comprising:

a plurality of dielectric layers forming a multilayer structure;

interlayer electrodes provided between said dielectric layers; and a via hole conductor provided so as to straddle some of said plurality of dielectric layers, said via hole conductor connecting all or part of said interlayer electrodes, wherein said interlayer electrodes and said via hole conductor form a plurality of strip lines and a plurality of capacitors, and said first susceptance element and said second susceptance element are formed by said plurality of strip lines, said plurality of capacitors and said via hole conductor.

The 13th aspect of the present invention is the high-frequency device according to the 1st aspect, wherein said high-frequency element comprises a high-frequency filter.

The 14th aspect of the present invention is the high-frequency device according to the 13th apsect, wherein said high-frequency filter comprises a surface acoustic wave filter having:

a piezoelectric substrate; and at least one interdigital transducer provided on said piezoelectric substrate.

The 15th aspect of the present invention is the high-frequency device according to the 14th aspect, further comprising first and second lead electrodes formed on said piezoelectric substrate, said first and second lead electrodes being respectively provided between said pair of balanced terminals and said interdigital transducer electrode, wherein said first and second lead electrodes differ in shape or length from each other.

The 16th aspect of the present invention is the high-frequency device according to the 14th apsect, wherein said interdigital transducer electrode comprises at least three interdigital transducer electrodes: first, second and third interdigital transducer electrodes;

said surface acoustic wave filter comprises a balanced surface acoustic wave filter using at least one pair of said interdigital transducer electrodes;

one group of electrode fingers of said first interdigital transducer electrode is connected to an unbalanced input/output terminal, while the other group of electrode fingers of said first interdigital transducer element is grounded;

one group of electrode fingers of said interdigital second transducer electrode is connected to a first terminal which is one of said pair of balanced terminals, while the other group of electrode fingers of said interdigital second transducer element is grounded; and one group of electrode fingers of said third interdigital transducer electrode is connected to a second terminal which is the other of said pair of balanced terminals, while the other group of electrode fingers of said interdigital third transducer element is grounded.

The 17th aspect of the present invention is the high-frequency device according to the 14th aspect, wherein said interdigital transducer electrode comprise at least three interdigital transducer electrodes: first, second and third interdigital transducer electrodes;

said surface acoustic wave filter comprises a balanced surface acoustic wave filter using at least one pair of said interdigital transducer electrodes;

one group of electrode fingers of said first interdigital transducer electrode is connected to a first terminal which is one of said pair of balanced terminals, while the other group of electrode fingers of said second interdigital transducer element is connected to a second terminal which is the other of said pair of balanced terminals; and groups of electrode fingers of said second and third interdigital transducer electrodes are connected in a common unbalanced input/output terminal, while the other groups of electrode fingers of said second and third interdigital transducer electrodes are grounded.

The 18th aspect of the present invention is the high-frequency device according to the 16th or the 17th apsect, further comprising:

a first resonator connected between one of the groups of second electrode fingers and said first terminal; and a second resonator connected between one of the groups of third electrode fingers and said second terminal.

The 19th aspect of the present invention is the high-frequency device according to the 18th apsect, wherein said first resonator and said resonator differ in shape from each other.

The 20th aspect of the present invention is the high-frequency device according to the 1st aspect, further comprising an inductor connecting one of said pair of balanced terminals and the other of said pair of balanced terminals to each other.

The 21st aspect of the present invention is a communication apparatus comprising at least-one of transmitting means and receiving means, wherein said transmitting means or said receiving means uses the high-frequency device according to any one of the 1st to the 4th, the 6th, the 8th, the 17th to the 20th aspects.

The first inductor may be mounted as a component part on the surface layer of the multilayer member.

Also, the first inductor may be constituted by the plurality of strip lines and the via hole conductor formed in the inner layers of the multilayer member.

BRIEF DESCRIPTION OF THE DRAWINGS

FIG. 2(a) shows a transmission characteristic.

FIG. 2(b) shows an amplitude balance characteristic.

FIG. 2(c) shows a phase balance characteristic.

FIG. 9(a)–(b) are a diagram showing the construction of electrodes of a conventional surface acoustic wave filter.

FIGS. 10(a), 10(b), and 10(c) are diagrams showing characteristics of the conventional surface acoustic wave filter.

FIG. 10(a) shows a transmission characteristic.

FIG. 10(b) shows an amplitude balance characteristic.

FIG. 10(c) shows a phase balance characteristic.

FIG. 12 is an exploded perspective view of the composite electronic component in Embodiment 5 of the present invention.

DESCRIPTION OF SYMBOLS

Figure 1:
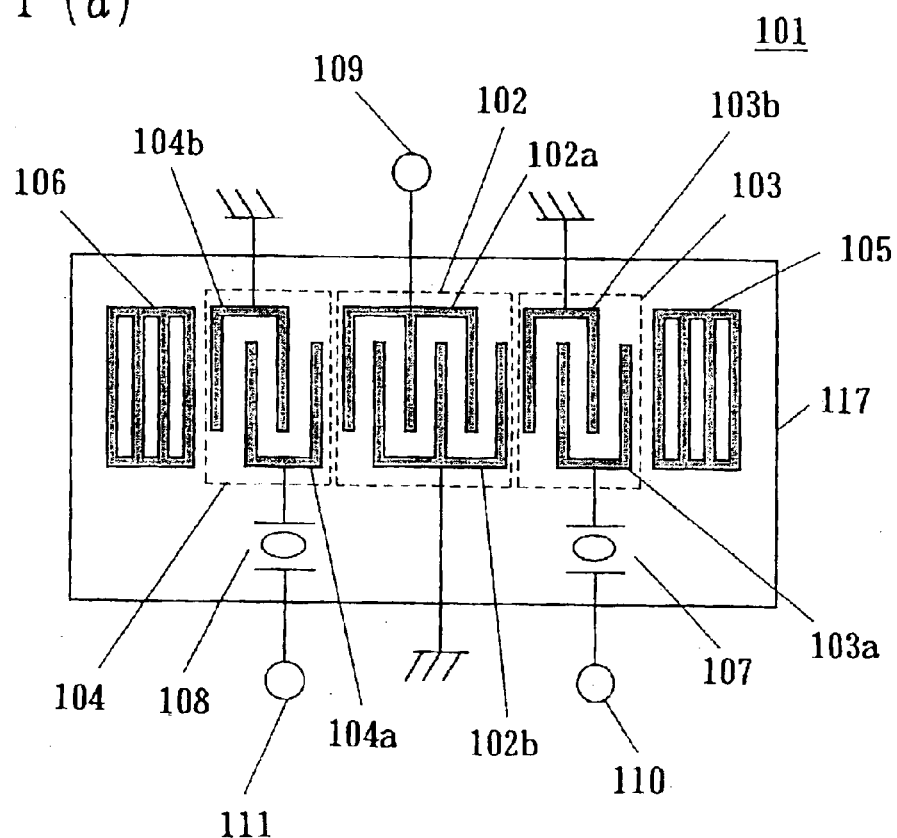
FIG. 1(a) is a diagram showing the construction of a surface acoustic wave filter in Embodiment 1 of the present invention.
FIG. 1(b) is a diagram showing the construction of a balanced filter device in Embodiment 1 of the present invention.
Figure 1:
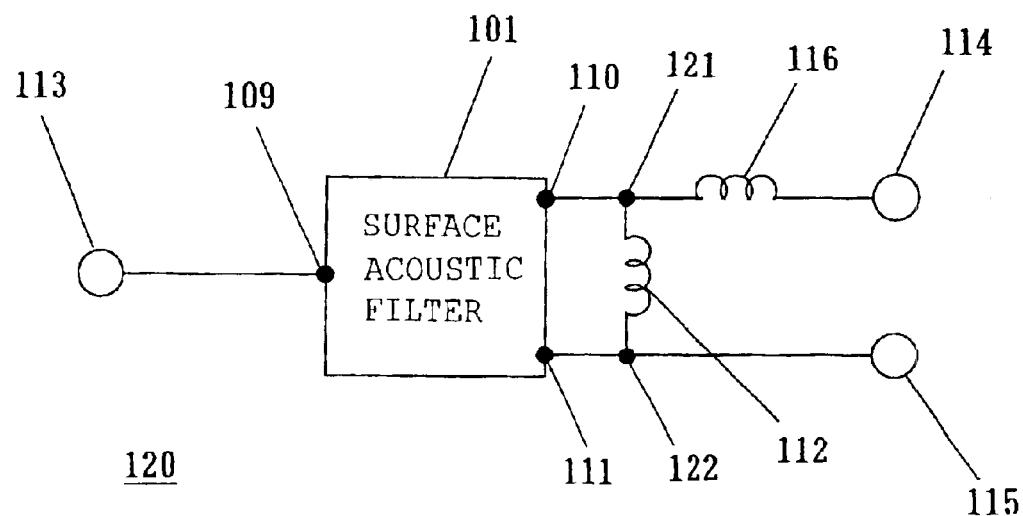

101 Surface acoustic filter
102, 130, 104 IDT electrode
105, 106 Reflector electrode
107, 108 Surface acoustic wave resonator
109 Unbalanced input/output terminal
110, 111 Balanced input/output terminals
112 First inductor
113 First input/output terminal
114 Second input/output terminal
115 Third input/output terminal
116 Second inductor

PREFERRED EMBODIMENTS OF THE INVENTION

Embodiments of the present invention will be described with reference to the drawings.

(Embodiment 1)

A balanced filter device according to Embodiment 1 of the present invention will be described with reference to FIG. 1(a). FIG. 1(a) shows the construction of a surface acoustic wave filter having balanced input/output terminals according to this embodiment, and FIG. 1(b) shows the construction of the balanced filter device having the surface acoustic wave filter shown in FIG. 1(a).

Referring to FIG. 1(a), the surface acoustic wave filter 101 of this embodiment is comprises first, second, and third IDT electrode 102, 103, and 104 which are comprised of a pair of groups of electrode fingers, first and second reflector electrodes 105 and 106, and first and second surface acoustic wave resonators 107 and 108 on a piezoelectric substrate 117.

The first and second surface acoustic wave resonators 107 and 108 are used for the purpose of providing an attenuation characteristic in filter characteristics, and for matching, etc. The first and second surface acoustic wave resonators 107 and 108 are identical in shape to each other.

A group of electrode fingers 102a in two groups of electrode fingers of the first IDT electrode 102 is connected to an unbalanced input/output terminal 109, while the other group of electrode fingers 102b is grounded. A group of electrode fingers 103a in two groups of electrode fingers of the second IDT electrode 103 is connected to the first acoustic wave resonator 107, while the other group of electrode fingers 103b is grounded. A group of electrode fingers 104a in two groups of electrode fingers of the third IDT electrode 104 is connected to the second acoustic wave resonator 108, while the other group of electrode fingers 104b is grounded.

Further, the first acoustic wave resonator 107 is connected to a first terminal 110, which is one of the balanced input/output terminals, and the second acoustic wave resonator 108 is connected to a second terminal 111, which is the other of the balanced input/output terminals. The surface acoustic wave filter having unbalanced and balanced input/output terminals is obtained by being constructed as described above. The construction of this filter is the same as the conventional surface acoustic wave filter 901 shown in FIG. 9(a) except that the first and second surface acoustic resonators 107 and 108 are provided. In actuality, the unbalanced input/output terminal 109 and the balanced input/output terminals 110 and 111 are formed on one piezoelectric substrate on which the IDT electrodes 102 and 103 are also formed. However, the input/output terminals in this embodiment are schematically shown as if they are out of the piezoelectric substrate 117. Illustrations are also made in the same manner in the drawings for each surface acoustic wave filter described below.

In the balanced filter device 120 shown in FIG. 1(b), the unbalanced input/out terminal 109 of the surface acoustic wave filter 101 is connected to a first input/output terminal 113.

A second inductor 116 which functions as a reactance element is connected between the first terminal 110, which is one of the balanced input/output terminals, and a second input/output terminal 114, while the other of the balanced input/output terminals, i.e., the second terminal 111, is connected to a third input/output terminal 115.

Further, a first inductor 112 for impedance matching is connected to a point 121 of connection between the first terminal 110, which is one of the balanced input/output terminals, and the second inductor 116, and to a point 122 of connection between the second terminal 111 and the third input/output terminal 115.

Figure 2:
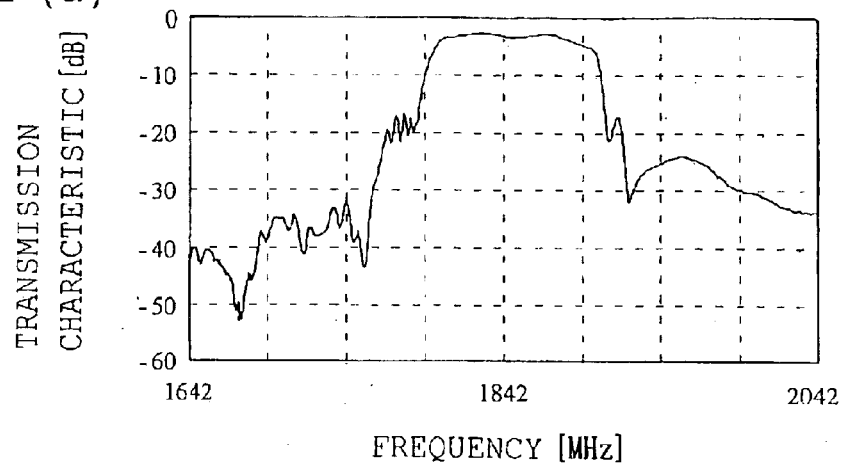
FIGS. 2(a), 2(b), and 2(c) are diagrams showing characteristics of the balanced filter device in Embodiment 1 of the present invention.
Figure 2:
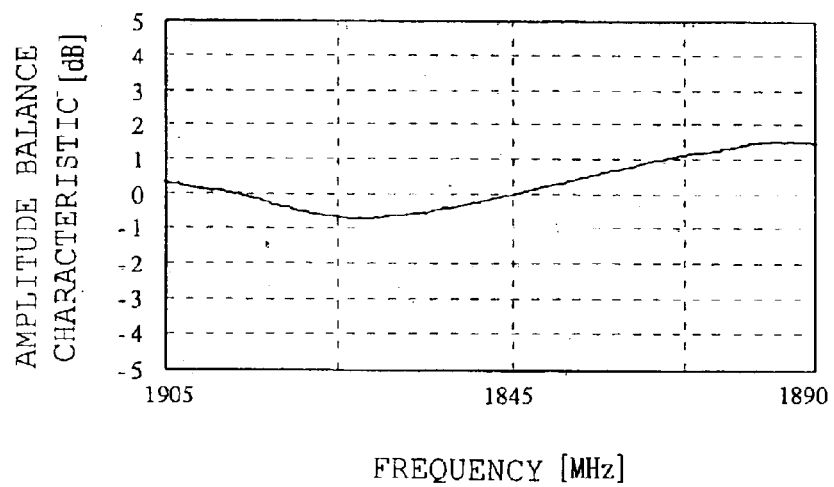
Figure 2:
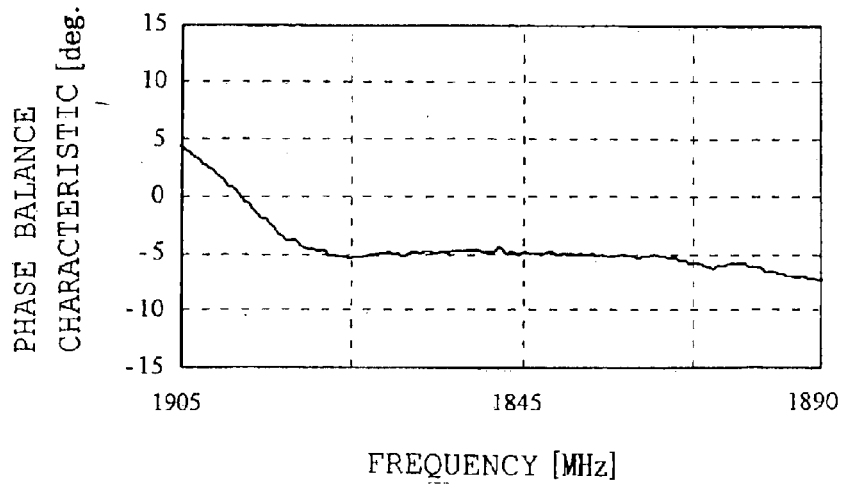

FIGS. 2(a), 2(b), and 2(c) show an example of characteristics of the balanced filter device 120 shown in FIG. 1(b). FIG. 2(a) shows a transmission a transmission characteristic, FIG. 2(b) shows an amplitude balance characteristic in the passband, and FIG. 2(c) shows a phase balance characteristic in the passband. As shown in FIGS. 2(a) to 2(c), the second inductor 116 functioning as a reactance element is connected to the first terminal 110 in the balanced input/output terminals to obtain an amplitude balance characteristic of −0.7 dB to +1.5 dB in the passband, and a phase balance characteristic of −7.1° to +4.4°. Thus, the phase balance characteristic can be improved in comparison with that of the surface acoustic wave filter shown in FIG. 10, while the transmission and amplitude balance characteristics are not substantially deteriorated. The amplitude balance characteristic of FIG. 2(b) is depicted by being exaggerated. In actuality, substantially no deterioration occurs in amplitude balance characteristic.

The balance characteristics shown in FIGS. 2(b) and 2(c) are characteristics as seen at the second input/output terminal 114 from the third input/output terminal 115. More specifically, the phase balance characteristic deteriorates from 0° to a value on the minus side. That is, the phase at the first terminal 110 in the balanced input/output terminals advances and, therefore, the second inductor 116 is connected not on the side of the third input/output terminal 115, from which the characteristic is observed, but on the side of the second input/output terminal 114 to improve the phase balance characteristic.

The impedance of the second inductor 116 connected in this embodiment is substantially 13.5 Ω and its value standardized with respect to the terminal impedance is 0.18.

While an example of deterioration on the minus side in the characteristic of the conventional device has been referred to for description of this embodiment, it is also possible to improve the phase balance characteristic by connecting an inductor on the side of the third input/output terminal 115 with respect to a case where a deterioration occurs on the plus side in the characteristic of the conventional device as seen from the third input/output terminal 115 from which the characteristic is observed. That is, the second inductor 116 is provided between the first or second terminal 110 or 111 in the balanced input/output terminals at which a phase advance as seen from the other of the first and second terminals 110 and 111 is recognized when the phase balance characteristic of the surface acoustic wave filter 101 in a single state is measured and the second input/output terminal 114 or the third input/output terminal 115 to which the terminal at which the phase advance is observed is connected. That is, the impedance value of the one of the pair of balanced input/output terminals 110 or 111 which has a phase advance relative to the other of the pair of balanced input/output terminals become larger than that of the other of the pair of balanced terminals.

Further, the first acoustic wave resonator 107 is connected to a first terminal 110, which is one of the balanced input/output terminals, and the second acoustic wave resonator 108 is connected to a second terminal 111, which is the other of the balanced input/output terminals. The surface acoustic wave filter having unbalanced and balanced input/output terminals is obtained by being constructed as described above. The construction of this filter is the same as the conventional surface acoustic wave filter 901 shown in FIG. 9(a) except that the first and second surface acoustic resonators 107 and 108 are provided. In actuality, the unbalanced input/output terminal 109 and the balanced input/output terminals 110 and 111 are formed on one piezoelectric substrate on which the IDT electrodes 102 and 103 are also formed. However, the input/output terminals in this embodiment are schematically shown as if they are out of the piezoelectric substrate 117. Illustrations are also made in the same manner in the drawings for each surface acoustic wave filter described below.

Figure 3:
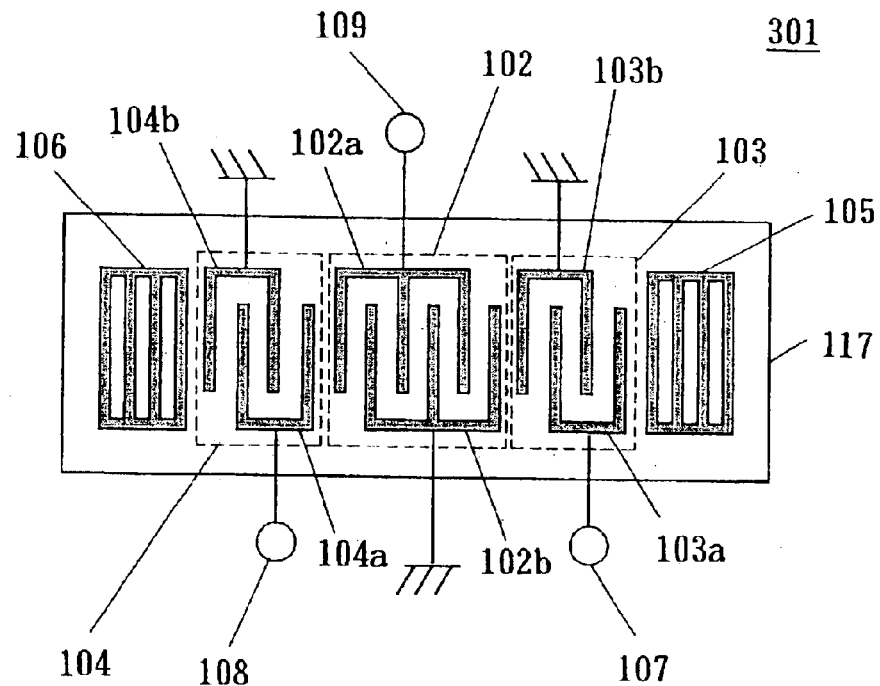
FIG. 3 is a diagram showing a first example of the construction of the surface acoustic wave filter in Embodiment 1.

While the surface acoustic wave filter in this embodiment is constructed as shown in FIG. 1(a), a surface acoustic wave filter 301 shown in FIG. 3 may alternatively be constructed without using the first and second surface acoustic resonators 107 and 108 shown in FIG. 1(a) (constructed in the same manner as the conventional surface acoustic wave filter shown in FIG. 9).

Figure 4:
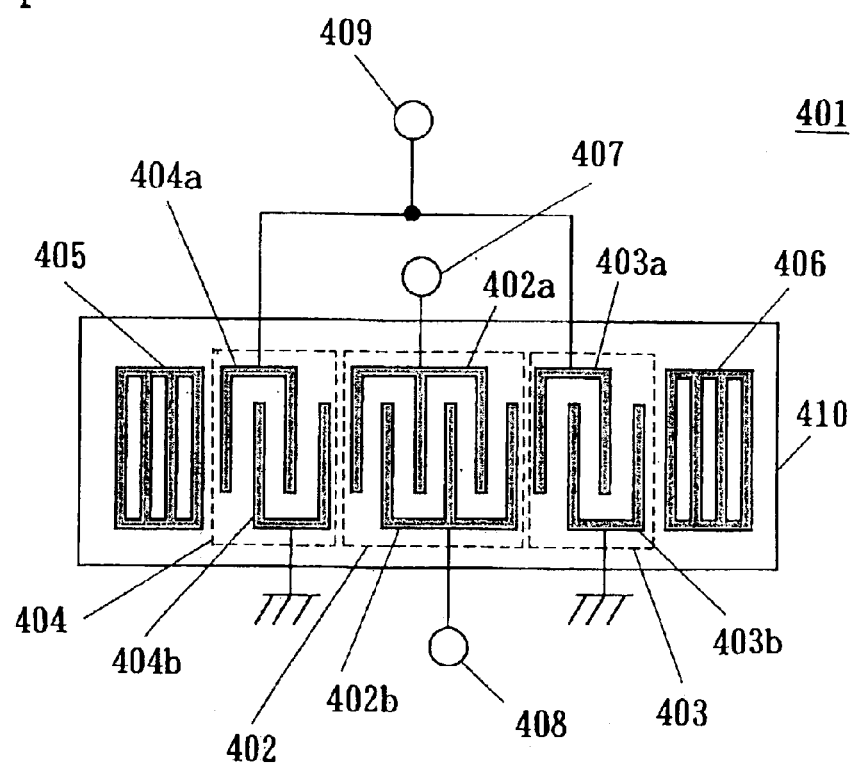
FIG. 4 is a diagram showing a second example of the construction of the surface acoustic wave filter in Embodiment 1.

Also, a surface acoustic wave filter 401 shown in FIG. 4 may alternatively be constructed which is constituted by first, second, and third IDT electrodes 402, 403, and 404 each having a pair groups of electrode fingers, and first and second reflector electrodes 405 and 406, the electrodes being formed on a piezoelectric substrate 410, one group of electrode fingers 402a of the first IDT electrode 402 being connected to a first terminal 407, which is one of balanced input/output terminals, the other group of electrode fingers 402b of the first IDT electrode 402 being connected to a second terminal 408, which is the other of the balanced input/output terminals, groups of electrode fingers 403a and 404a of the second and third IDT electrodes 403 and 404 being connected to an unbalanced input/output terminal 409, the other groups of electrode fingers 403b and 404b being grounded. The same effect of the present invention is also achieved in this case.

That is, in the balanced filter device 120 of this embodiment, even if the incorporated surface acoustic wave filter has deterioration in phase balance characteristic like that in the conventional filter device, an inductor is connected outside the filter to cause a difference in impedance value between the first terminal 110 and the second terminal 111 functioning as balanced input/output terminals to improve the phase balance characteristic. If the surface acoustic wave filter of the present invention is incorporated in a communication apparatus or the like together with other circuits, it is implemented in balanced filter device 120. In such a case, the surface acoustic wave filter can easily be obtained as a filter having an improved phase balance characteristic.

In this embodiment, the first inductor 112 is connected between the first terminal 110, which is one of the balanced input/output terminals, and the second terminal 111, which is the other of the balanced input/output terminals. However, if impedance matching can be achieved without using the first inductor 112, it is not necessary to connect the first inductor 112 and a configuration without the first inductor 112 may be used.

(Embodiment 2)

Figure 5:
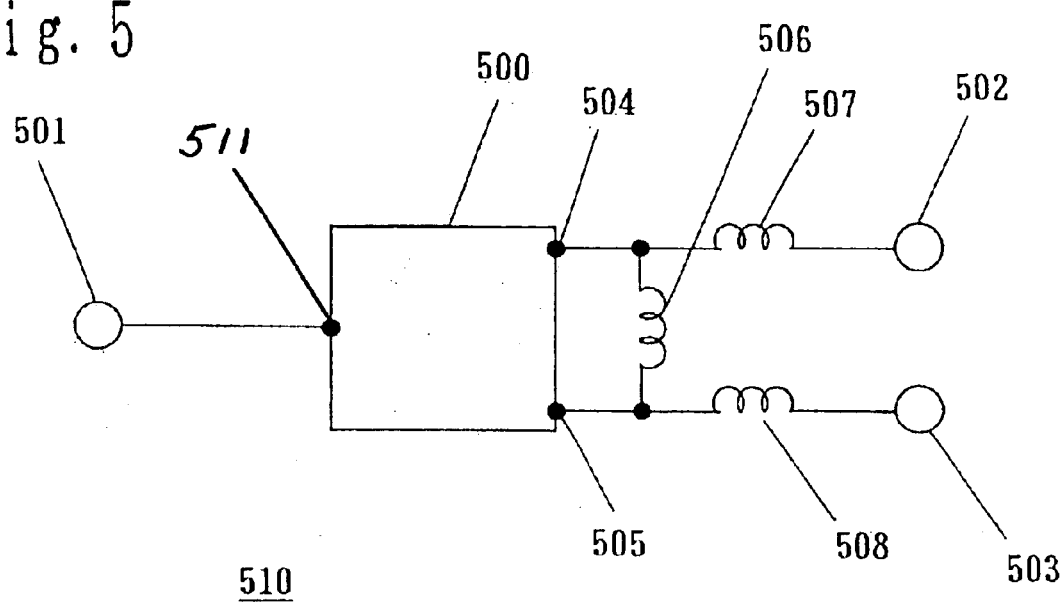
FIG. 5 is a diagram showing the construction of a balanced filter device in Embodiment 2 of the present invention.

A balanced filter device which represents Embodiment 2 of the present invention will be described with reference to FIG. 5. FIG. 5 shows the construction of a balanced filter device with balanced input/output terminals according to this embodiment.

Referring to FIG. 5, the filter device of this embodiment has a surface acoustic wave filter 500 constituted by IDT electrodes, reflector electrodes, surface acoustic wave resonators, etc., corresponding to those in the surface acoustic wave filter 101 shown in FIG. 1(a). A first input/output terminal 501 is connected to an unbalanced input/output terminal 511 of the surface acoustic wave filter 500 (corresponding to the unbalanced input/output terminal 109 shown in FIG. 1), and a first inductor 506 for impedance matching is connected between a first terminal 504, which is one of the balanced input/output terminals, and a second terminal 505, which is the other of the balanced input/output terminals.

Further, a second inductor 507 which functions as a reactance element is connected between the first terminal 504, which is one of the balanced input/output terminals, and a second input/output terminal 502, while a third inductor 508 which functions as a reactance element is connected between the second terminal 505, which is the other of the balanced input/output terminals, and a third input/output terminal 503.

The first terminal 110, which is one of the balanced input/output terminals shown in FIG. 1(a), corresponds to the first terminal 504, which is one of the balanced input/output terminals shown in FIG. 5, while the second terminal 111, which is the other of the balanced input/output terminals shown in FIG. 1(a), corresponds to the second terminal 505, which is the other of the balanced input/output terminals shown in FIG. 5. The relationship between the values of the second inductor 507 and the third inductor 508 is such that the difference between the inductor values is set to the same value as that of the second inductor 116 in Embodiment 1, thereby obtaining the same characteristics as those shown in FIGS. 2(a) to 2(c). In short, the setting is such that the value of the inductor (second inductor 507 or third inductor 508) connected to the first or second terminal 504 or 505 in the balanced input/output terminals at which a phase advance as seen from the other of the terminals 504 and 505 is recognized when the phase balance characteristic of the surface acoustic wave filter 500 in a single state is measured is greater. That is, the impedance value of the one of the pair of balanced input/output terminals 504 or 505 which has a phase advance relative to the other of the pair of balanced input/output terminals become larger than that of the other of the pair of balanced terminals.

Contrary to this, if the values of the second inductor 507 and the third inductor 508 are equal to each other, the same characteristics as those of the conventional device shown in FIG. 10 are exhibited and no improvements in balance characteristics are provided.

That is, different reactance components are respectively connected to the first and second terminals 504 and 505 to improve the phase balance characteristic in comparison with that of the surface acoustic wave filter shown in FIG. 10 without causing substantially no deterioration in transmission and amplitude balance characteristics.

More specifically, with respect to a deterioration in phase balance characteristic from 0° to a value on the minus side shown in FIG. 10(c), the second inductor 507 having an impedance higher than that of the third inductor 508 connected on the side of the third input/output terminal 503 is connected on the side of the second input/output terminal 502 to improve the phase balance characteristic. The difference between the impedances of the second inductor 507 and the third inductor 508 connected in this device is 13.5 (and its value standardized with respect to the terminal impedance is 0.18.

While an example of deterioration on the minus side in the characteristic of the conventional device has been referred to for description of this embodiment, it is also possible to improve the phase balance characteristic by increasing the impedance value of the third inductor 508 on the side of the third input/output terminal 503 from which the characteristic is observed. Is increased relative to that of the second inductor 507 on the side of the second input/output terminal 502 with respect to a case where a deterioration occurs on the plus side in the characteristic of the conventional device as seen from the third input/output terminal 503.

This embodiment has been described with respect to the case where the difference between the values of the second inductor 507 and the third inductor 508 standardized with respect to the terminal impedance is 0.18. However, the same effect can be obtained if this value is not larger than 0.2.

While the surface acoustic wave filter in this embodiment is constructed in the same manner as that shown in FIG. 1(a), the same effect can also be obtained even in a case where a surface acoustic wave filter constructed as shown in FIG. 3 or 4 is used.

In this embodiment, the first inductor 506 is connected between the first terminal 504, which is one of the balanced input/output terminals, and the second terminal 505, which is the other of the balanced input/output terminals. However, if impedance matching can be achieved without using the first inductor 506, it is not necessary to connect the first inductor 506.

(Embodiment 3)

An example of the structure of a balanced filter device which represents Embodiment 3 of the present invention will be described with reference to FIG. 6.

Figure 6:
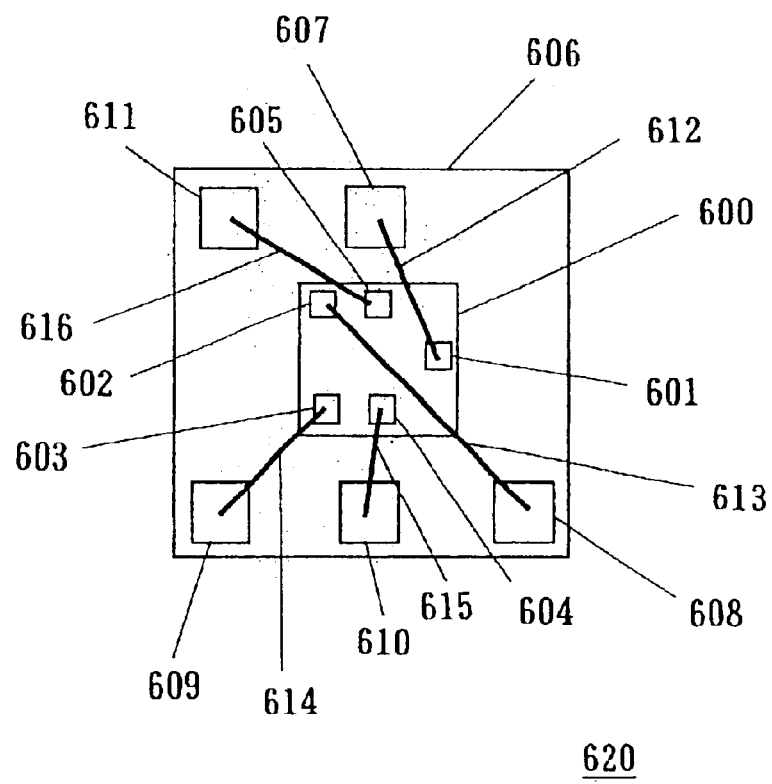
FIG. 6 is a diagram showing the structure of a balanced filter device in Embodiment 3 of the present invention.

Referring to FIG. 6, the balanced filter device 620 of this embodiment has a surface acoustic wave filter constructed on a piezoelectric substrate 600, and this surface acoustic wave filter is mounted by using wire bonding on a package substrate 606 made mainly of a ceramic or the like. An unbalanced input/output terminal electrode 601, a first terminal electrode 602, which is one of balanced input/output terminals, a second terminal electrode 603, which is the other of the balanced input/output terminals, and grounding electrodes 604 and 605 are formed on the piezoelectric substrate 600.

First to fifth electrodes 607 to 611 are formed on the package substrate 606. The unbalanced input/output terminal electrode 601 is connected to the first electrode 607 by a first wire 612. The first terminal electrode 602, which is one of the balanced input/output terminals, is connected to the second electrode 608 by a second wire 613, while the second terminal electrode 603, which is the other of the balanced input/output terminals, is connected to the third electrode 609 by a third wire 614. The grounding electrodes 604 and 605 are connected to the fourth and fifth electrodes 610 and 611 by fourth and fifth wires 615 and 616, respectively.

The second wire 613 connected to the first terminal electrode 602, which is one of the balanced input/output terminals, and the third wire 614 connected to the second terminal electrode 603, which is the other of the balanced input/output terminals, are formed so as to be asymmetrical with each other with respect to their lengths in order that these wires have different impedances.

At the time of mounting on the package substrate 606, the direction of the piezoelectric substrate 600 is changed so that the wires respectively connected to the first and second electrodes 602 and 603 formed as the balanced input/output terminals so that the wires are asymmetrical with each other with respect to their lengths, thus providing a configuration equivalent to that shown in FIG. 5 to obtain an improved phase balance characteristic such as that shown in FIG. 2(b).

While reactance components are formed by using wires in this embodiment, similar reactance components may be formed by using lead electrodes on the piezoelectric substrate to achieve the same effect. Only in such a case, the second wire 613 and the third wire 614 may be formed so as to be symmetrical with each other with respect to their lengths. Needless to say, the second wire 613 and the third wire 614 in such a case may be made different in length.

It is also possible to change the impedances of the loads on the balanced input/output terminals by forming the first surface acoustic wave resonator 107 and the second surface acoustic wave resonator 108 shown in FIG. 1 so that these resonators are different in shape from each other, thereby obtaining a phase balance characteristic similarly improved.

(Embodiment 4)

Figure 7:
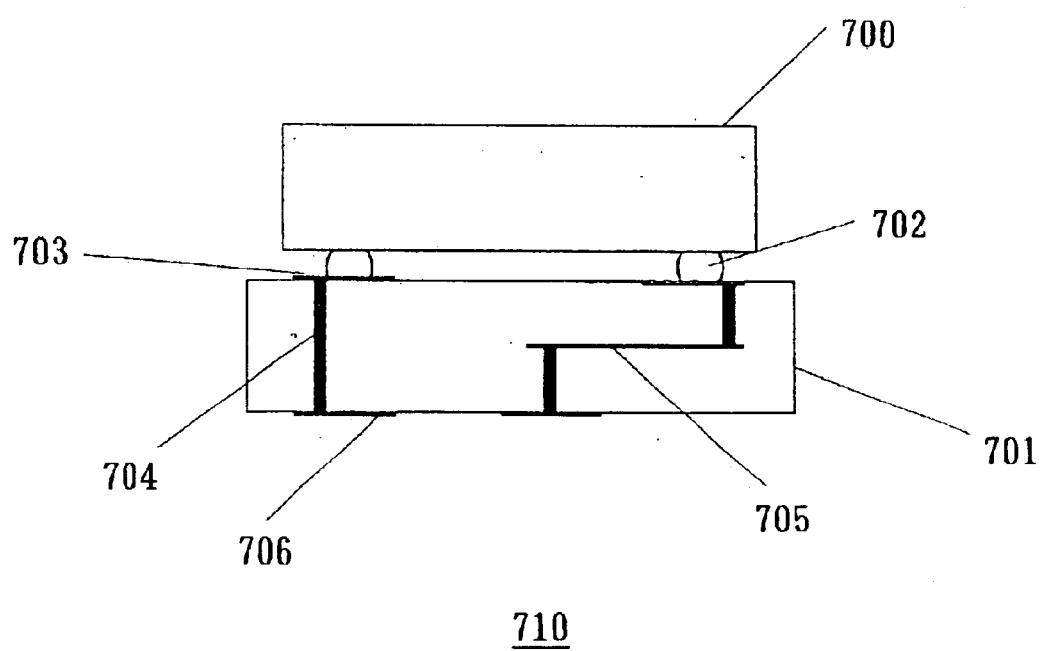
FIG. 7 is a cross-sectional view of the structure of a balanced filter device in Embodiment 4 of the present invention.

A balanced filter device which represents Embodiment 4 of the present invention will be described with reference to FIGS. 7 and 8. FIG. 7 is a cross-sectional view of the structure of the balanced filter device of this embodiment, and FIG. 8 is an exploded perspective view of the structure.

Referring to FIG. 7, the balanced filter device 710 is constructed in such a manner that a surface acoustic wave filter having the same construction as that shown in FIG. 1, 3, or 4 is mounted by using flip chip mounting on a multilayer member 701 having a plurality of dielectric layers. An unbalanced input/output terminal, balanced input/output terminals and other portions of the surface acoustic wave filter are electrically connected to electrodes 703 on the multilayer member 701 by using bumps 702 made mainly of gold, for example. Only the balanced input/output terminals are shown in the figure.

The electrodes 703 are electrically connected to terminal electrodes 706 formed on a bottom surface of the multilayer member 701 by via hole electrodes 704 and internal electrodes 705 formed through the multilayer member 701 or on an inner layer of the multilayer member 701. The terminal electrodes 706 are electrically connected to a main substrate (not shown).

Figure 8:
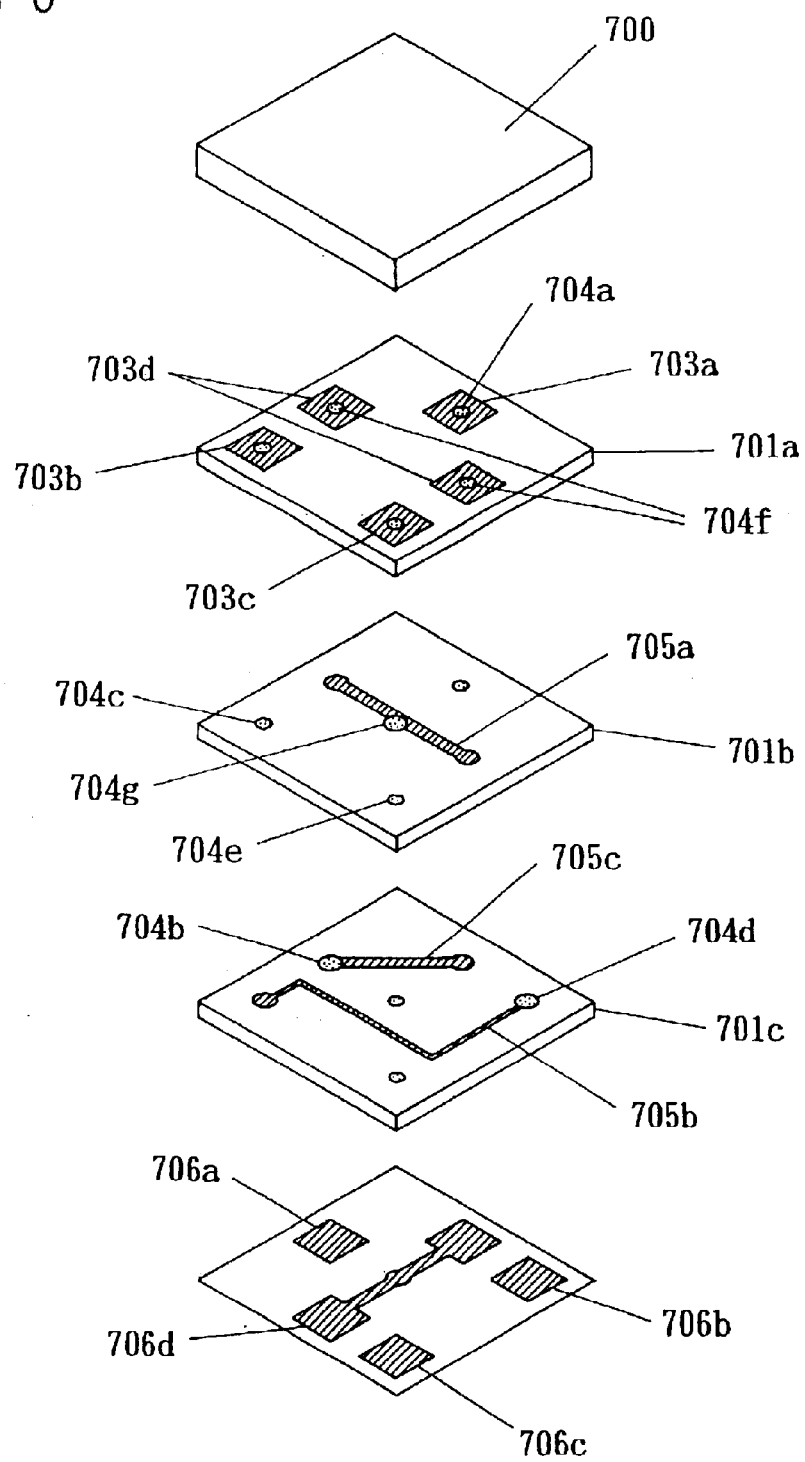
FIG. 8 is an exploded perspective view of the structure of the balanced filter device in Embodiment 4 of the present invention.

FIG. 8 shows an exploded perspective view of an example of the structure shown in FIG. 7. The multilayer member 701 is formed of three dielectric layers 701a to 701c. The number of dielectric layers forming the multilayer member is selected according to one's need.

Electrodes 703a to 703d are formed on the first dielectric layer 701a. An inner electrode 705a is formed on the second dielectric layer 701b. Inner electrodes 705b and 705c are formed on the third dielectric layer 701c. Terminal electrodes 706a to 706d for connection to the main substrate (not shown) are formed on the back surface of the third dielectric layer 701c. Via hole electrodes 704a to 704g for electrically connecting the electrodes 703a to 703d, the internal electrodes 705a to 705c and the terminal electrodes 706a to 706d are provided as required.

The unbalanced input/output terminal of the surface acoustic wave filter formed on the piezoelectric substrate 700 is electrically connected to the electrode 703a by a bump or the like. The pair of input/output terminals formed as the balanced input/output terminals are electrically connected respectively to the electrodes 703b and 703c by bumps or the like, and a grounding terminal is electrically connected to the electrode 703d by a bump or the like.

The electrode 703a is connected by the via hole electrode 704a to the inner electrode 705c formed on the third dielectric layer 701c and is further connected electrically by the via hole electrode 704b to the terminal electrode 706a formed on the back surface of the third dielectric layer 701c.

The electrode 703b is connected to the inner electrode 765b by the via hole electrode 704c and is further connected electrically by the via hole electrode 704d to the terminal electrode 706b formed on the back surface of the third dielectric layer 701c.

The electrode 703c is connected by the via hole electrode 704e to the terminal electrode 705c formed on the back surface of the third dielectric layer 701c.

The electrode 703d is connected to the inner electrode 705a by the via hole electrode 704f and is further connected electrically by the via hole 705g to the terminal electrode 706d formed on the back surface of the third dielectric layer 701c.

The inner electrodes 705a to 705c and the via hole electrodes 704e to 704g have inductance components. It is therefore possible to form an inductor having a desired value by adjusting the length and width of the inner electrode 705c. Therefore, the inductance components of the inner electrode 705c and the via hole electrodes 704c and 704d formed as inner layer portions of the multilayer member 701 are connected to one of the pair of input/output terminals formed as the balanced input/output terminals, while only the inductance component of the via hole electrode 704e is connected to the other input/output terminal.

That is, in the equivalent circuit shown in FIG. 5, the inner electrode 705c and the via hole electrodes 704c and 704d correspond to the second inductor 507, and the via hole 704e corresponds to the third inductor 508.

Therefore, when the surface acoustic wave filter is mounted on a small multilayer package substrate, different inductance components can be respectively connected to the pair of input/output terminals formed as the balanced input/output terminals of the surface acoustic wave filter by selecting the shapes of the inner electrodes formed on the inner layers of the multilayer member. Consequently, an improved phase balance characteristic such as that shown in FIG. 2(b) can be obtained by connecting the different inductors to the balanced input/output terminals.

While the reactance components have been described with respect to Embodiments 1 to 4, it is also possible to connect a susceptance element, more specifically a capacitance between the first terminal in the balanced input/output terminals and the ground and between the second terminal and the ground.

Figure 15:
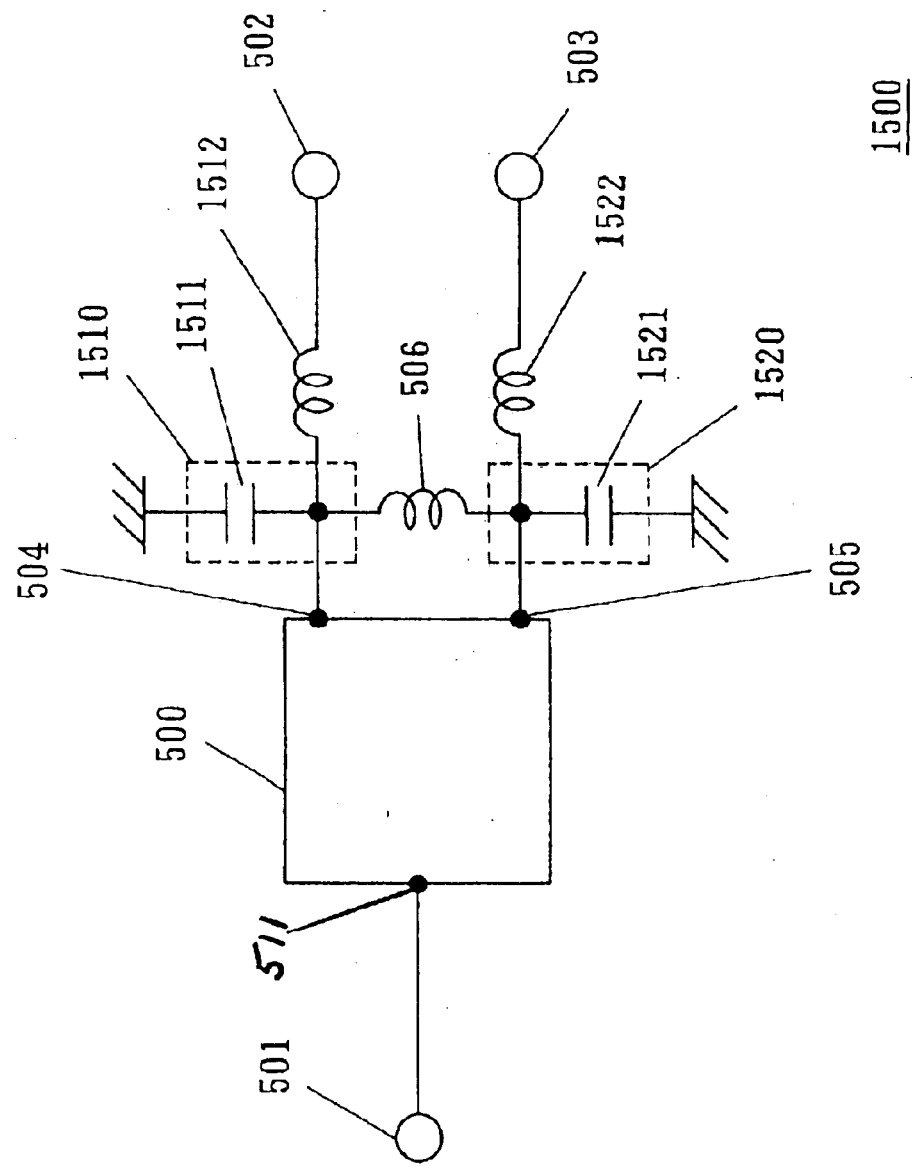
FIG. 15 is a diagram showing the construction of the other example of a balanced filter device in Embodiment 1 to 4 of the present invention.

FIG. 15 shows the construction of a balanced filter device in which susceptance elements are connected. In FIG. 15, portions identical or corresponding to those shown in FIG. 5 are indicated by the same reference characters. The detail description for the identical or corresponding portions is omitted. A susceptance element 1510 is provided for connection between a first terminal 504 in the balanced input/output terminals of a surface acoustic wave filter 500 and a second input/output terminal 502. A susceptance element 1520 is provided for connection between a second terminal 505 in the balanced input/output terminals of the surface acoustic wave filter 500 and a third input/output terminal 503.

The susceptance element 1510 is constituted by a first capacitor 1511 having its one end connected to a point of connection between the first terminal 504 in the balanced input/output terminals and the second input/output terminal 502, and its other end grounded.

The susceptance element 1520 is constituted by a second capacitor 1521 having its one end connected to a point of connection between the second terminal 505 in the balanced input/output terminals and the third input/output terminal 503, and its other end grounded.

In the thus-constructed device, the admittance value of the susceptance element (susceptance element 1510 or 1520) connected to the first or second terminal 504 or 505 in the balanced input/output terminals at which a phase advance as seen from the other of the terminals 504 and 505 is recognized when the phase balance characteristic of the surface acoustic wave filter 500 in a single state is measured is set smaller. That is, the impedance value of the one of the pair of balanced input/output terminals 504 or 505 which has a phase advance relative to the other of the pair of balanced input/output terminals become larger than that of the other of the pair of balanced terminals.

The arrangement may alternatively be such that a fourth inductor 1512 and a fifth inductor 1522 are removed.

In such a case, the effect of the present invention can be improved if the value obtained by standardizing the admittance of the susceptance elements connected to the first and second terminals with respect to the terminal impedance is 5 or more.

Further, only one of the first susceptance element 1510 and the second susceptance element 1520 may be provided. In such a case, the susceptance element may be provided at one of the first and second terminals 504 and 505 formed as the balanced input/output terminals at which a phase advance as seen from the other of the first and second terminals 504 and 505 is recognized.

In a case where mounting is performed as shown in FIGS. 7 and 8, capacitance components formed by wiring or the like on the multilayer package substrate and piezoelectric substrate may be utilized to change the load value without changing the device size.

(Embodiment 5)

Figure 11:
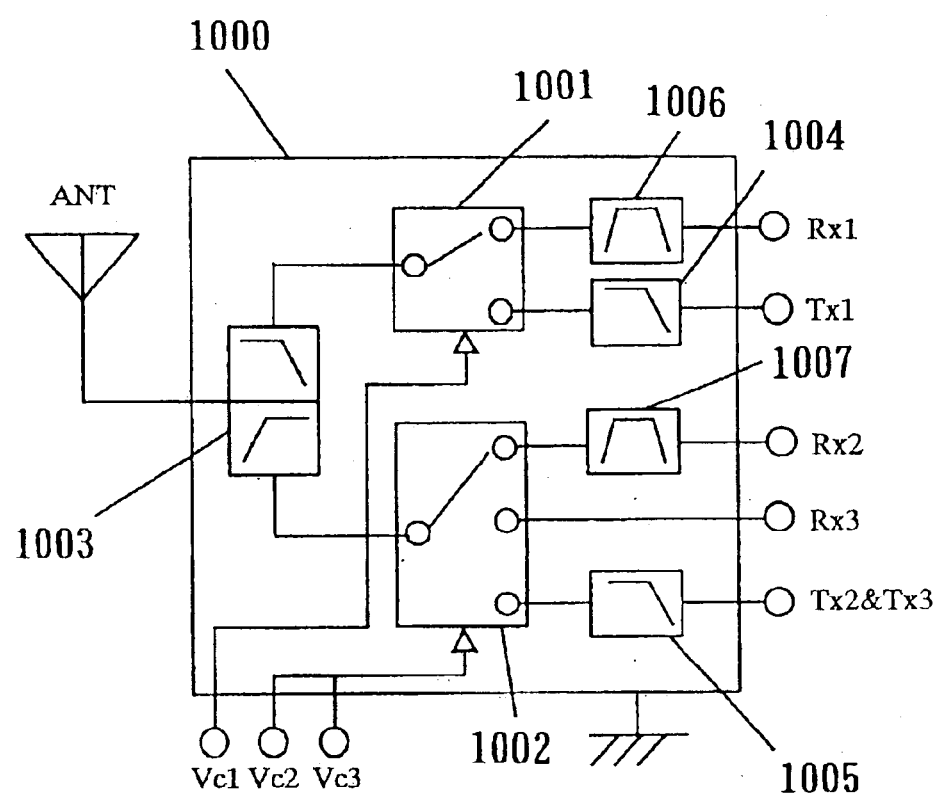
FIG. 11 is a block diagram of a composite electronic component in Embodiment 5 of the present invention.
Figure 13B:
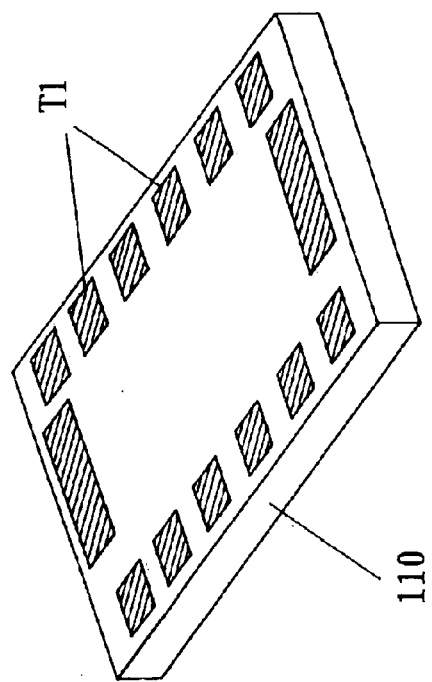
FIG. 13(b) is a diagram showing the composite electronic component (reverse side).
Figure 13A:
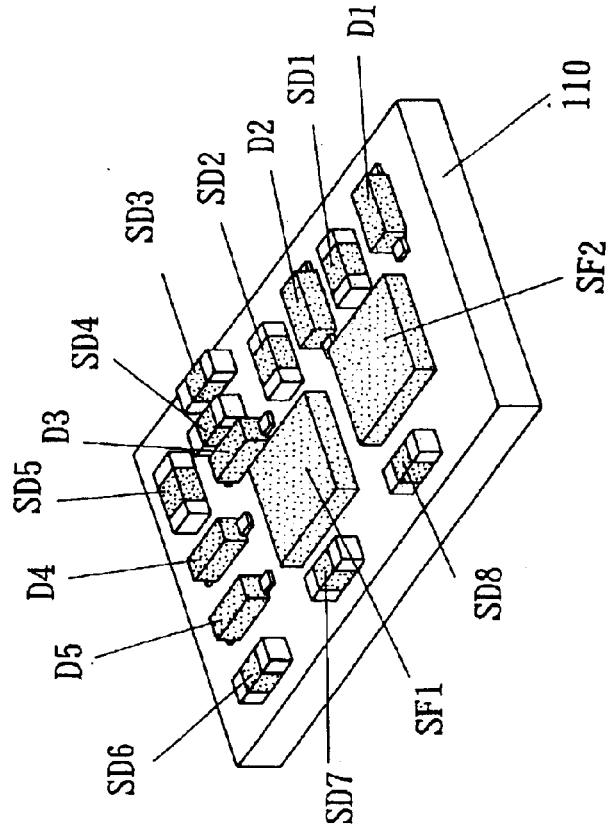
FIG. 13(a) is a diagram showing the composite electronic component (front side) in Embodiment 5 of the present invention.
Figure 14:
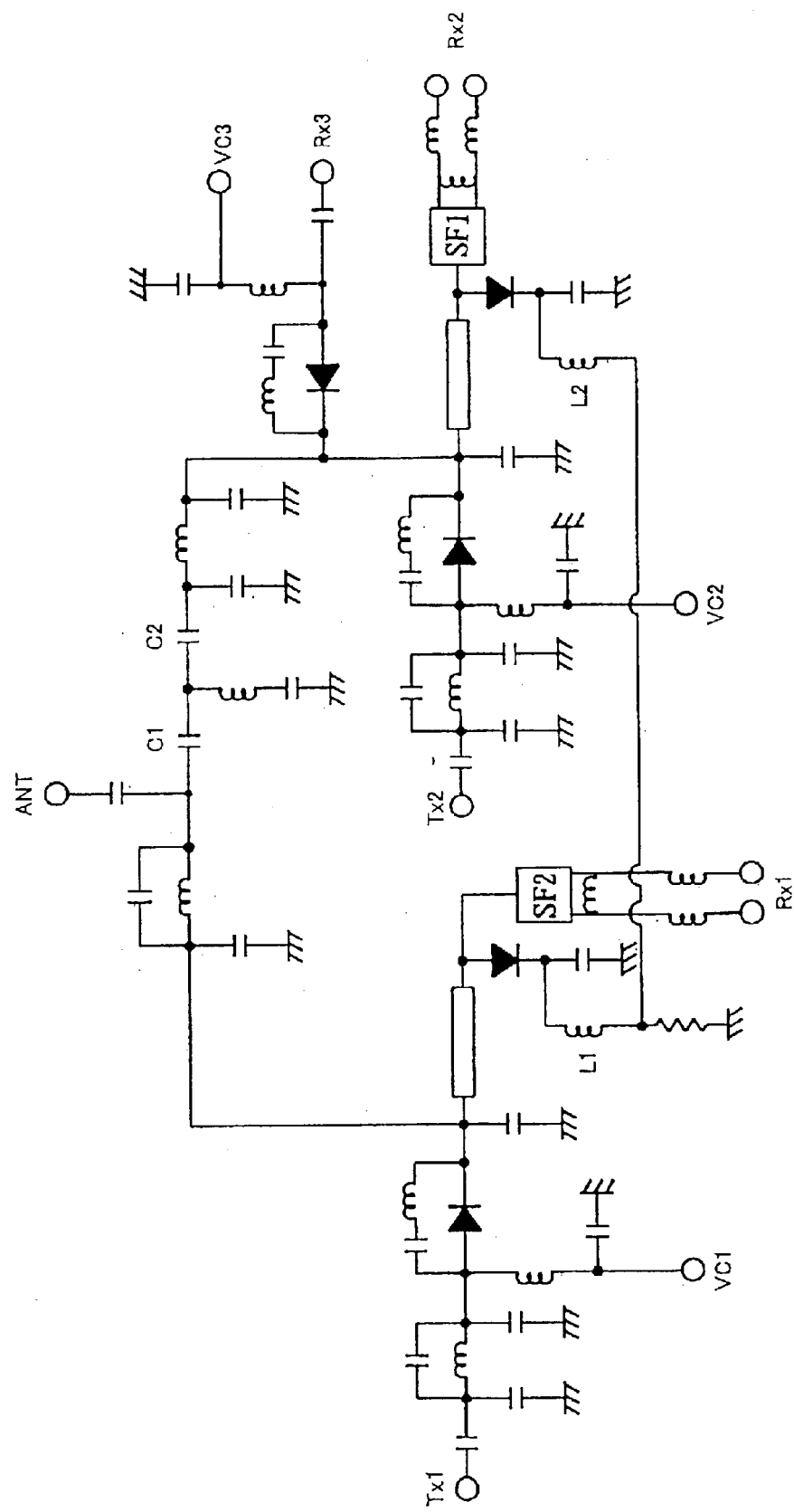
FIG. 14 is a circuit diagram of the composite electronic component in Embodiment 5 of the present invention.

A composite electronic component which represents Embodiment 5 of the present invention will be described with reference to FIGS. 11 to 14. FIG. 11 is a block diagram of the composite electronic component of this embodiment. FIG. 12 is an exploded perspective view of the composite electronic component of this embodiment (the portion of the illustration below a dielectric layer DL1 representing a back surface of the dielectric layer DL1). FIG. 13(a) is a diagram showing the composite electronic component (front side) of this embodiment. FIG. 13(b) is a diagram showing the composite electronic component (reverse side) of this embodiment. FIG. 14 is a circuit diagram of the composite electronic component of this embodiment.

The composite electronic component 1000 of this embodiment is a triple-band high-frequency switch having filtering functions for allowing signals in a transmission frequency band and a reception frequency band in each of a first frequency band (EGSM), a second frequency band (DCS) and a third frequency band (PCS) to pass therethrough. The composite electronic component 1000 has switching circuits (transmission/reception switch circuits) 1001 and 1002, a splitting means (splitting circuit) 1003. The composite electronic component 1000 also has low-pass filters (LPF) 1004 and 1005 for suppressing harmonic distortion at the time of transmission, and band-pass filters (BPF) 1006 and 1007 for extracting only necessary signals at the time of reception.

PIN diodes are ordinarily used for the transmission/reception switch circuits 1001 and 1002. Inductors and capacitors constituting the transmission/reception switch circuits 1001 and 1002, the splitting circuit 1003, and the low-pass filters 1004 and 1005 are formed as electrode patterns on inner layers in a multilayer member or mounted as chip parts on a surface layer. In this manner, the splitting circuit 1003, the transmission/reception switch circuits 1001 and 1002, the low-pass filters 1004 and 1005, and the band-pass filters 1006 and 1007 formed as a surface acoustic wave filter are realized as one stacked device.

Referring to FIG. 12, the composite electronic component of this embodiment is constituted by fifteen dielectric layers DL1 to DL15. The number of dielectric layers is suitably selected according to necessary characteristics of the composite electronic component.

As each dielectric layer, a glass ceramic substrate may be used which is formed by mixing a low-melting point glass frit in a ceramic powder such as a compound having forsterite or alumina as a main component. In a green sheet formed from a slurry obtained by mixing an organic binder and an organic solvent in the ceramic powder, a multiplicity of via holes for electrical connection between pieces of multilayer wiring are formed by using a mechanical punch or by laser machining.

On predetermined green sheets, printing is performed by using a conductive paste having a powder of silver (gold or copper) as a main component of an electroconductive material to form wiring patterns, and the via holes for interlayer connection between the wiring patterns on the green sheets are filled with a conductive paste. Strip lines and capacitor electrodes are thereby formed.

Fifteen green sheets obtained in this manner are accurately positioned relative to each other, laminated on one on another from the dielectric layer DL1 to the dielectric layer DL15, and heated and pressed under certain conditions, thereby obtaining an integrally combined multilayer member 1200. This multilayer member is dried and thereafter fired at 400 to 500 degrees in an oxidizing atmosphere in a furnace to burn out the organic binder in the green sheets. In a case (1) where a powder of gold or silver is used as a main component of the conductive material, the multilayer member is fired in ordinary air in a temperature range from about 850 to 950 degrees. In a case (2) where a powder of copper is used, the multilayer member is fired in an inert gas or in a reducing atmosphere in the same temperature range. The multilayer member 1200 is finally obtained in this manner.

As shown in FIG. 13(a), on the upper surface of the multilayer member 1200 having a multilayer structure incorporating various strip lines and capacitors constituting the composite electronic component are mounted SAW filters SF1 and SF2, diodes D1 to D5, and chip parts SD1 to SD8 such as capacitors and resistors with terminals T2 interposed therebetween. These parts are electrically connected to internal circuits in the multilayer member 1200.

A plurality of terminals T1 for surface mounting of the composite electronic components on a main substrate in an electronic apparatus are formed on the back surface of the dielectric layer DL1. These terminals T1 and n are formed by printing or patterning a conductive paste such as that mentioned above.

The stacked structure of wiring patterns in the composite electronic component having the above-described multilayer structure will be described by taking several examples.

On the first, seventh and fourteenth dielectric layers DL1, DL7, and DL14, ground electrodes G1, G2, and G3 are formed by printing for example, and via holes Vg1 are placed at suitable positions in the second to fourteenth dielectric layers DL2 to DL14 to electrically connect the ground electrodes G1, G2, and G3. Grounding terminal electrodes Tg1 and a grounding electrode G1 in the terminals T1 placed on the back surface of the first dielectric layer DL1 are also connected electrically by the via hole electrodes Vg1.

The strip line electrode pattern on the fourteenth dielectric layer DL14 is connected to the strip line electrode pattern on the thirteenth dielectric layer DL13 by via hole electrodes Vp11 and Vp21 in an interlayer connection manner. Also, the strip line electrode pattern on the thirteenth dielectric layer DL13 is connected to the strip line electrode pattern on the twelfth dielectric layer DL12 by via hole electrodes Vp12 and Vp22 in an interlayer connection manner. Thus, the strip lines L1 and L2, for example, are respectively connected through the fix layers: the ninth to fourteenth dielectric layers DL9 to DL16 by the via hole electrodes from one layer to another.

Capacitors C1 and C2 are connected in series in such a manner that the electrode pattern for the capacitor C1 is provided on the eleventh dielectric layer DL11, the electrode pattern used in common for the capacitors C1 and C2 is provided on the tenth dielectric layer DL10, and the electrode pattern for the capacitor C2 is provided on the ninth dielectric layer DL9.

Similarly, stripe line electrode patterns, capacitor electrode patterns, and via hole electrode patterns are suitably placed and are suitably connected electrically to the diodes, etc., formed on the surface layer of the multilayer member 1200, thus forming on the multilayer member 1200 the circuit of the composite electronic component shown in FIG. 14. The strip lines L1 and L2 and the capacitors C1 and C2 shown in FIG. 12 correspond to the inductors and the capacitors shown in FIG. 13(a).

The strip lines and capacitors are thus constructed. All the input/output terminals of the composite electronic component in this embodiment are by via hole electrodes collectively on the back surface of the first dielectric layer DL1.

Thus, the mount area at the time of mounting on the main substrate in the electronic apparatus can be limited.

The connection relationship between the balanced input/output terminals of the surface acoustic wave filter SF2 and the electrodes on the inner layers of the multilayer member will be described in more detail. The surface acoustic wave filter SF2 is electrically connected to the terminals T1 formed on the surface layer of the multilayer member 1200 by using soldering mounting or the like. One of the balanced input/output terminals is connected to the strip line Ld21 formed on the fourteenth dielectric layer DL14 by the via hole electrode formed in the fifteenth dielectric layer DL15, and the other of the balanced input/output terminals is connected to the strip line Ld22 formed on the fourteenth dielectric layer DL14 by the via hole electrode formed in the fifteenth dielectric layer DL15. Further, the strip line Ld21 is connected to the terminal T1 formed on the bottom surface of the multilayer member 1200 by the via hole electrode Vd2 formed through the first to fourteenth dielectric layers DL1 to DL14.

On the other hand, the strip line Ld11 is connected to the terminal T1 formed on the bottom surface of the multilayer member 1200 by the strip line Ld12 formed on the thirteenth dielectric layer DL13, the strip line Ld13 formed on the twelfth dielectric layer DL12, and the via hole electrode Vd1 formed through the first to fourteenth dielectric layers DL1 to DL14.

The strip lines Ld11, Ld12, Ld13, and Ld21, and the via hole electrodes Vd1 and Vd2 have inductance components. It is therefore possible to form an inductor having a desired value by adjusting the length and width of each electrode. Therefore, the inductor components of the strip line Ld21 and the via hole electrode Vd1 formed on or through the inner layer of the multilayer member 1200 are connected to one of the balanced input/output terminals, while the inductor components of the strip lines Ld11, Ld12, and Ld13, and the via hole electrode Vd1 are connected to the other of the balanced input/output terminals. The inductor chip part SD 7 on the surface layer of the multilayer member 1200 is connected by solder mounting of the like to the terminal n formed on the surface layer. Further, the chip part SD7 is also connected to the strip lines Ld11 and Ld21 by the via hole electrodes formed in the fifteenth dielectric layer DL15.

That is, with respect to the balanced input/output terminal portions of the surface acoustic wave filter, if the surface acoustic wave filter SF2 is the surface acoustic wave filter 500 in the equivalent circuit shown in FIG. 5, the strip line Ld21 and the via hole electrode Vd2 correspond to the second inductor 507, and the strip lines Ld11 to Ld13 and the via hole electrode Vd1 correspond to the third inductor 508. Also, the chip part SD7 mounted on the surface layer corresponds to the first inductor 506.

Thus, the surface acoustic wave filter can be mounted on the multilayer member and different inductor components can be formed by selecting the strip lines and via hole electrodes formed on or through the inner layers of the multilayer member. Thus, an improved phase balance characteristic such as that shown in FIG. 2(b) can be obtained by connecting different inductors to the balanced input/output terminals.

In a case where the composite electronic component of this embodiment is used, for example, in a portable telephone or the like, it is mounted on a main substrate constituting a wireless circuit. In such a case, since the multilayer structure and the surface acoustic wave filter are combined, the mount area can be remarkably reduced in comparison with the conventional art. As a result, reductions in size and thickness of the portable telephone can be achieved.

In this embodiment, different strip lines are respectively connected to the pair of input/output terminals formed as balanced input/output terminals to set different load impedances. However, the same effect can also be obtained by connecting capacitors having different impedances between the balanced input/output terminals and ground. In this case, a balanced filter device having susceptance elements-as shown in FIG. 15 is realized.

While this embodiment has been described with respect to a case where two surface acoustic wave filters are mounted, the same effect can also be obtained in a case where only one surface acoustic wave filter is mounted or a case where three or more surface acoustic wave filters are mounted.

While this embodiment has been described with respect to use in a combination of three systems EGSM, DCS, and PCS, similar use is also possible in a combination of other systems, e.g., a combination of EGSM, DCS, and UMTS (Universal Mobile Telecommunications System).

While this embodiment has been described by taking an example of a triple-band composite electronic component using three communication systems, the same effect can also be obtained by changing the configuration of the switch circuit in a case where a dual-band composite electronic component using two communication systems (e.g., EGSM and UMTS) or a high-frequency switch using four or more systems (e.g., EGSM, AMPS (Advanced Mobile Phone Service), DCS, and PCS) is formed.

While this embodiment has been described by taking an example of use of diodes in a switch circuit, the same effect can also be obtained in a case where a GaAs switch is used in only one of the two switch circuits or in a case where a GaAs switch is used in each of the two switch circuits.

While this embodiment has been described by taking an example of a composite electronic component incorporating a high-frequency component, the same effect can also be obtained in the case of a composite electronic component incorporating any other high-frequency component such as a low-pass filter or a band-pass filter.

Each of the balanced filter devices 120, 510, 620, and 710 and the composite electronic component 1000 is an example of the high-frequency device of the present invention.

Each of the surface acoustic wave filters 101, 301, 401, 500, and SF2 is an example of the high-frequency element of the present invention.

The pair of input/output terminals 110 and 111 formed as balanced input/output terminals is an example of one and the other of the pair of balanced terminals of the present invention.

Each of the first inductor 506 and the second inductor 507 is an example of the first reactance element of the present invention, and the third inductor 508 is an example of the second reactance element of the present invention.

The first susceptance element 1510 is an example of the first susceptance element of the present invention, and the second susceptance element 1520 is an example of the second susceptance element of the present invention.

The first surface acoustic wave resonator 107 is an example of the first resonator of the present invention, and the second surface acoustic wave resonator 108 is an example of the second resonator of the present invention.

The first inductor 112 is an example of the inductor of the present invention.

However, the present invention is not limited to the above-described embodiments. In each of the above-described embodiments, the high-frequency element of the present invention is a surface acoustic wave filter. However, it may by a dielectric filter, a stacked filter, or a bulk wave filter if it has at least one pair of balanced terminals. In particular, it is desirable to apply the present invention to a filter in the 1800 MHz band, a high-frequency band from 2 GHz to a higher frequency, or a high-frequency band not exceeding 10 GHz.

Figure 16:
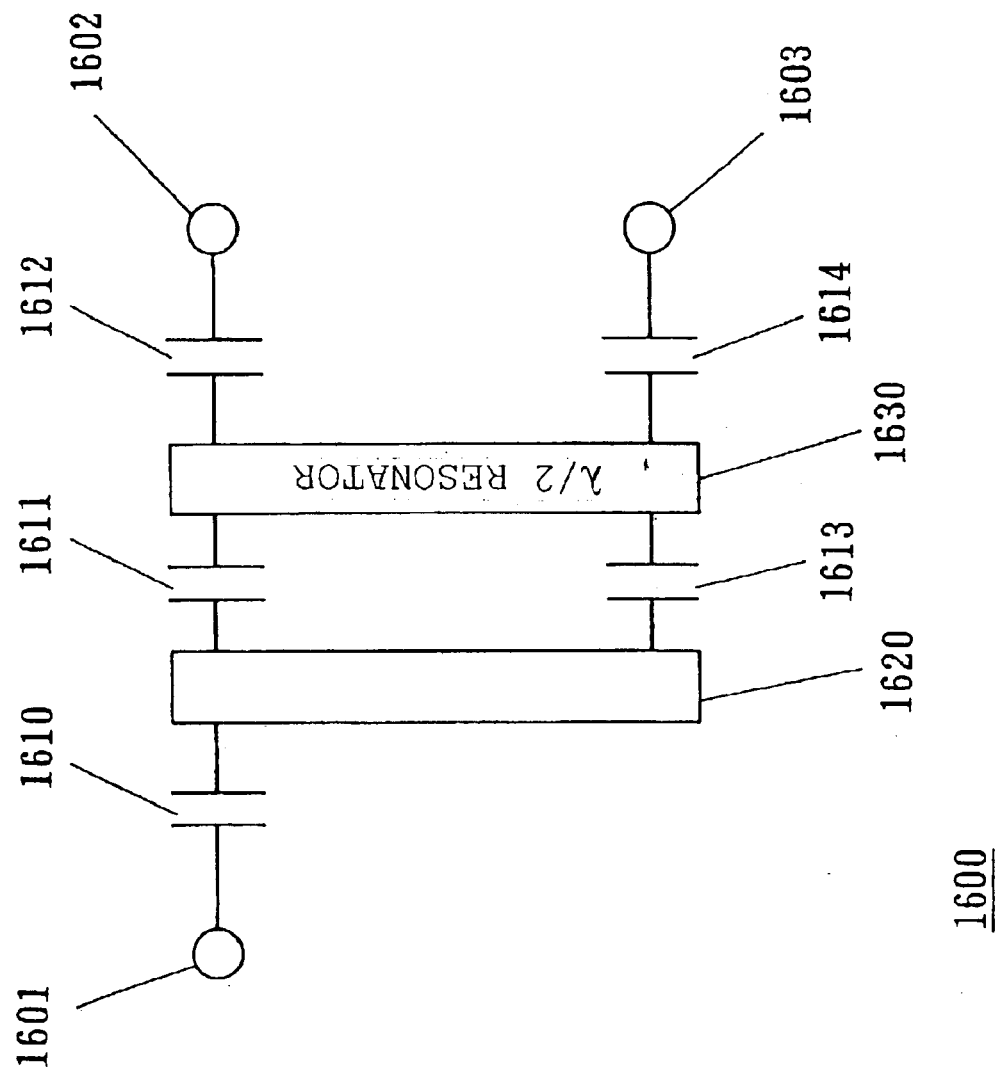
FIG. 16 is a diagram showing another example of the high-frequency element of the present invention.

FIG. 16 shows an example of such a filter. A filter 1600 shown in FIG. 16 is an unbalanced output/balanced output band-pass filter having an unbalanced input/output terminal 1601, a pair of balanced input/output terminals 1602 and 1603, capacitors 1610 to 1614 connected between the terminals, a first λ/2 resonator 1620 having its one end connected between the capacitor 1610 and the capacitor 1611 and the other end connected to the capacitor 1613, and a second λ/2 resonator 1630 having its one end connected between the capacitor 1611 and the capacitor 1612 and the other end connected between the capacitor 1613 and the capacitor 1614. Also in such a filter, mounting such as that described above with respect to each of the embodiments may be performed to set the impedance values of the first and second terminals 1602 and 1603 different from each other. The phase balance characteristic can be easily improved in this manner.

The high-frequency element of the present invention is not limited to filters. It may be applied to semiconductor elements. For example, it may be provided for a low-noise amplifier (LNA) or the like having a balanced circuit.

Further, the present invention may be realized as a communication apparatus incorporating the above-described high-frequency device.

Figure 17:
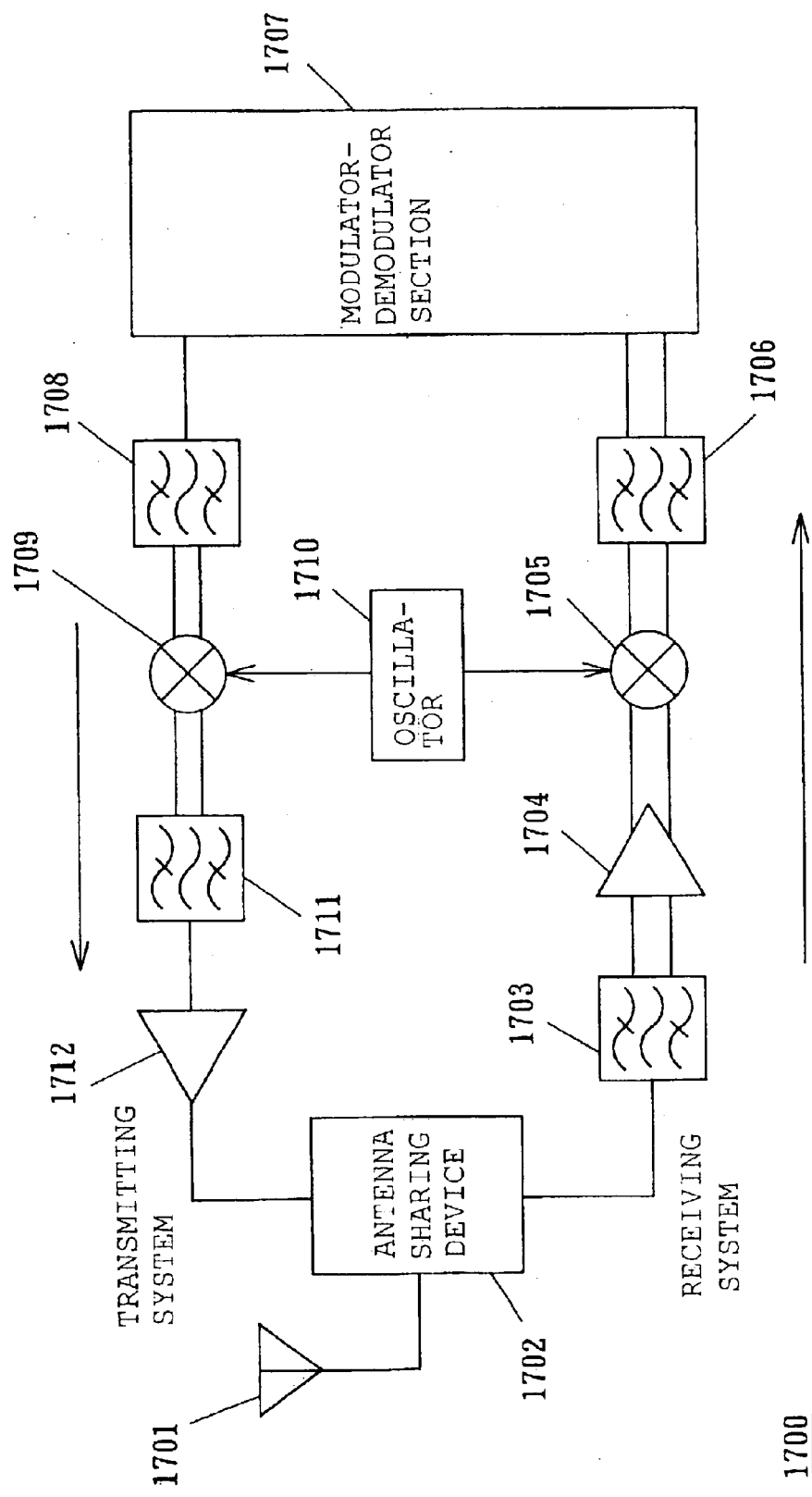
FIG. 17 is a diagram showing a communication apparatus incorporating the high-frequency element of the present invention.

FIG. 17 shows an example of use of a communication apparatus as a portable telephone. A portable telephone 1700 has an antenna 1701 for transmitting and receiving electric waves, an antenna sharing device 1702 for enabling the antenna 1701 to be shared by a transmitting system and a receiving system, an RF filter 1703 in the receiving system, a low-noise amplifier 1704, a frequency conversion section 1705, an IF filter 1706 in the receiving system, a modulator-demodulator section 1707 for performing modulation and demodulation of signals, an IF filter 1708 in the transmitting system, a frequency conversion section 1709, an RF filter 1711 in the transmitting system, a power amplifier 1712, and an oscillator 1710.

In this portable telephone, the balanced filter device in each of the above-described embodiments can be used as each of the RF filters 1711 and 1703. A high-frequency element formed as a semiconductor element may be used for the low-noise amplifier 1704.

As is apparent from the above description, the present invention is capable of providing a high-frequency device, etc., having a good phase balance characteristic.

What is claimed is:

1. A high-frequency device comprising:
 a high-frequency element having at least one pair of balanced terminals; and
 external input/output terminals connected to terminals of said high-frequency element, wherein one impedance value between one of the pair of balanced terminals and one of the external input/output terminals, and the other impedance value between the other of the pair of balanced terminals and the other of the external input/output terminals are different from each other.

2. The high-frequency device according to claim 1, wherein the difference of impedance values means that the impedance value of the one of the pair of balanced terminals having a phase advance relative to the other of the pair of balanced terminals is larger than that of the other of the pair of balanced terminals.

3. The high-frequency device according to claim 2, further comprising a first reactance element provided between at least one of the pair of balanced terminals and the external input/output terminal connected to the one of the pair of balanced terminals.

4. The high-frequency device according to claim 3, further comprising a second reactance element provided between the other of the pair of balanced terminals and the external input/output terminal connected to the other of the pair of balanced terminals, the second reactance element differing In impedance value from the first reactance element.

5. The high-frequency device according to claim 4, wherein at least one of said first reactance element and said second reactance element is realized as an inductance component of a wire used when said high-frequency element is mounted by wire bonding in said high frequency device.

6. The high-frequency device according to claim 4, wherein a value obtained by standardizing the difference between the impedance values of said first reactance element and said second reactance element with respect to the terminal impedance is not larger than 0.2.

7. The high-frequency device according to claim 4, further comprising a multilayer substrate having a surface-layer electrode provided on its one major surface, an inner-layer electrode on at least one layer provided in said multilayer substrate, and a via hole electrode which connects said surface-layer electrode and said inner-layer electrode to each other, wherein each of said external input/output terminals is realized as said surface-layer electrode;

said high-frequency device is mounted on the other major surface of said substrate; and at least one of said first reactance element and said second reactance element is provided by an inductance component based on said inner-layer electrode.

8. The high-frequency device according to claim 4, further comprising:
 a plurality of dielectric layers forming a multilayer structure;
 interlayer electrodes provided between said dielectric layers; and
 a via hole conductor provided so as to straddle some of said plurality of dielectric layers, said via hole conductor connecting all or part of said interlayer electrodes,
 wherein said interlayer electrodes and said via hole conductor form a plurality of strip lines and a plurality of capacitors, and
 said first reactance element and said second reactance element are formed by said plurality of strip lines, said plurality of capacitors and said via hole conductor.

9. The high-frequency device according to claim 4, further comprising:
 a plurality of dielectric layers forming a multilayer structure;
 interlayer electrodes provided between said dielectric layers; and
 a via hole conductor provided so as to straddle some of said plurality of dielectric layers, said via hole conductor connecting all or part of said interlayer electrodes,
 wherein said interlayer electrodes and said via hole conductor form a plurality of strip lines and a plurality of capacitors, and
 said first susceptance element and said second susceptance element are formed by said plurality of strip lines, said plurality of capacitors and said via hole conductor.

10. The high-frequency device according to claim 2, further comprising a first susceptance element having its one end connected between at least one of the pair of balanced terminals and the external input/output terminal connected to the one of the pair of balanced terminals, and having the other end grounded.

11. The high-frequency device according to claim 10, further comprising a second susceptance element having its one end connected between the other of the pair of balanced terminals and the external input/output terminal connected to the other of the pair of balanced terminals, and having the other end grounded, the second susceptance element differing in admittance value from the first susceptance element.

12. The high-frequency device according to claim 11, wherein a value obtained by standardizing the difference between the admittance values of said first susceptance element and said second susceptance element with respect to the terminal impedance is equal to or larger than 5.

13. The high-frequency device according to claim 1, wherein said high-frequency element comprises a high-frequency filter.

14. The high-frequency device according to claim 13, wherein said high-frequency filter comprises a surface acoustic wave filter having:
a piezoelectric substrate; and
at least one interdigital transducer provided on said piezoelectric substrate.

15. The high-frequency device according to claim 14, further comprising first and second lead electrodes formed on said piezoelectric substrate, said first and second lead electrodes being respectively provided between said pair of balanced terminals and said interdigital transducer electrode, wherein said first and second lead electrodes differ in shape or length from each other.

16. The high-frequency device according to claim 14, wherein said interdigital transducer electrode comprises at least three interdigital transducer electrodes: first, second and third interdigital transducer electrodes;
said surface acoustic wave filter comprises a balanced surface acoustic wave filter using at least one pair of said interdigital transducer electrodes;
one group of electrode fingers of said first interdigital transducer electrode is connected to an unbalanced input/output terminal, while the other group of electrode fingers of said first interdigital transducer element is grounded;
one group of electrode fingers of said interdigital second transducer electrode is connected to a first terminal which is one of said pair of balanced terminals, while the other group of electrode fingers of said interdigital second transducer element is grounded; and
one group of electrode fingers of said third interdigital transducer electrode is connected to a second terminal which is the other of said pair of balanced terminals, while the other group of electrode fingers of said interdigital third transducer element is grounded.

17. The high-frequency device according to claim 14, wherein said interdigital transducer electrode comprise at least three interdigital transducer electrodes: first, second and third interdigital transducer electrodes;
said surface acoustic wave filter comprises a balanced surface acoustic wave filter using at least one pair of said interdigital transducer electrodes;
one group of electrode fingers of said first interdigital transducer electrode is connected to a first terminal which is one of said pair of balanced terminals, while the other group of electrode fingers of said second interdigital transducer element is connected to a second terminal which is the other of said pair of balanced terminals; and
groups of electrode fingers of said second and third interdigital transducer electrodes are connected in a common unbalanced input/output terminal, while the other groups of electrode fingers of said second and third interdigital transducer electrodes are grounded.

18. The high-frequency device according to claim 16 or 17, further comprising:
a first resonator connected between one of the groups of second electrode fingers and said first terminal; and
a second resonator connected between one of the groups of third electrode fingers and said second terminal.

19. The high-frequency device according to claim 18, wherein said first resonator and said resonator differ in shape from each other.

20. The high-frequency device according to claim 1, further comprising an inductor connecting one of said pair of balanced terminals and the other of said pair of balanced terminals to each other.

21. A communication apparatus comprising at least one of transmitting means and receiving means, wherein said transmitting means or said receiving means uses a high-frequency device comprising:
a high-frequency element having at least one pair of balanced terminals; and
external input/output terminals connected to terminals of said high-frequency element, wherein one impedance value between one of the pair of balanced terminals and one of the external input/output terminals, and the other impedance value between the other of the pair of balanced terminals and the other of the external input/output terminals are different from each other.

* * * * *